(12) United States Patent
DeVita et al.

(10) Patent No.: US 12,550,744 B2
(45) Date of Patent: Feb. 10, 2026

(54) PACKAGES WITH BACKSIDE MOUNTED DIE AND EXPOSED DIE INTERCONNECTS AND METHODS OF FABRICATING THE SAME

(71) Applicant: Wolfspeed, Inc., Durham, NC (US)

(72) Inventors: Michael DeVita, Mesa, AZ (US); Qianli Mu, San Jose, CA (US)

(73) Assignee: Wolfspeed, Inc., Durham, NC (US)

( * ) Notice: Subject to any disclaimer, the term of this patent is extended or adjusted under 35 U.S.C. 154(b) by 791 days.

(21) Appl. No.: 17/848,538

(22) Filed: Jun. 24, 2022

(65) Prior Publication Data
US 2023/0421117 A1      Dec. 28, 2023

(51) Int. Cl.
*H01L 23/66*      (2006.01)
*H01L 23/00*      (2006.01)

(52) U.S. Cl.
CPC .............. *H01L 23/66* (2013.01); *H01L 24/20* (2013.01); *H01L 2223/6611* (2013.01); *H01L 2223/6655* (2013.01)

(58) Field of Classification Search
CPC ......... H01L 2223/6611; H01L 23/4824; H01L 23/49805; H01L 24/81; H01L 2224/12105; H01L 2224/73267; H01L 23/562; H01L 23/49838; H01L 21/4853; H01L 24/13–17; H01L 23/66; H01L 24/20; H01L 23/3185
See application file for complete search history.

(56) References Cited

U.S. PATENT DOCUMENTS

| | | | |
|---|---|---|---|
| 2011/0210444 A1* | 9/2011 | Jeng | H01L 24/97 |
| | | | 257/E23.173 |
| 2013/0341784 A1 | 12/2013 | Lin et al. | |
| 2015/0140736 A1 | 5/2015 | Pendse | |
| 2017/0084596 A1* | 3/2017 | Scanlan | H01L 23/3675 |
| 2020/0135639 A1* | 4/2020 | Cheah | H01L 23/528 |
| 2021/0098636 A1* | 4/2021 | Tai | H01L 23/3731 |
| 2021/0328552 A1* | 10/2021 | Tucker | H03F 3/21 |
| 2022/0043208 A1* | 2/2022 | Hsia | G02B 6/30 |
| 2022/0130773 A1 | 4/2022 | Pun et al. | |
| 2023/0352411 A1* | 11/2023 | Choi | H01L 25/50 |

OTHER PUBLICATIONS

Notification of Transmittal of the International Search Report and the Written Opinion of the International Searching Authority, or the Declaration, in corresponding PCT Application No. PCT/US2023/025354 (Sep. 20, 2023).

* cited by examiner

*Primary Examiner* — Wasiul Haider
(74) *Attorney, Agent, or Firm* — Myers Bigel, P.A.

(57) ABSTRACT

A method of fabricating a semiconductor device includes forming a protective structure on at least one die on a substrate. The protective structure exposes one or more electrical contacts on a first surface of the at least one die. Respective terminals are formed on the one or more electrical contacts exposed by the protective structure. Related packages and fabrication methods are also discussed.

26 Claims, 14 Drawing Sheets

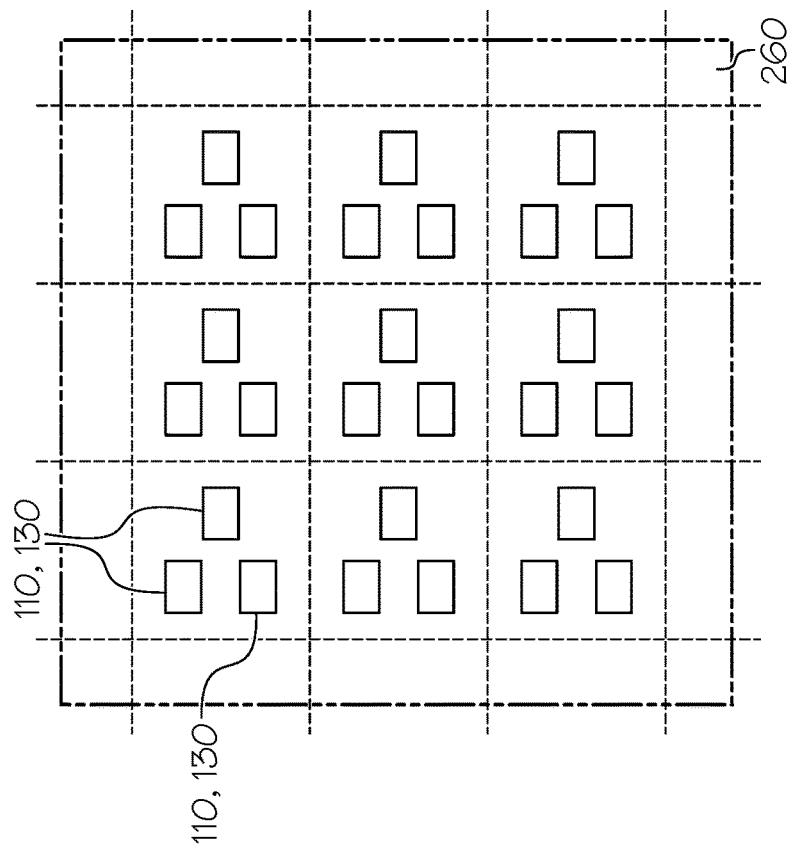
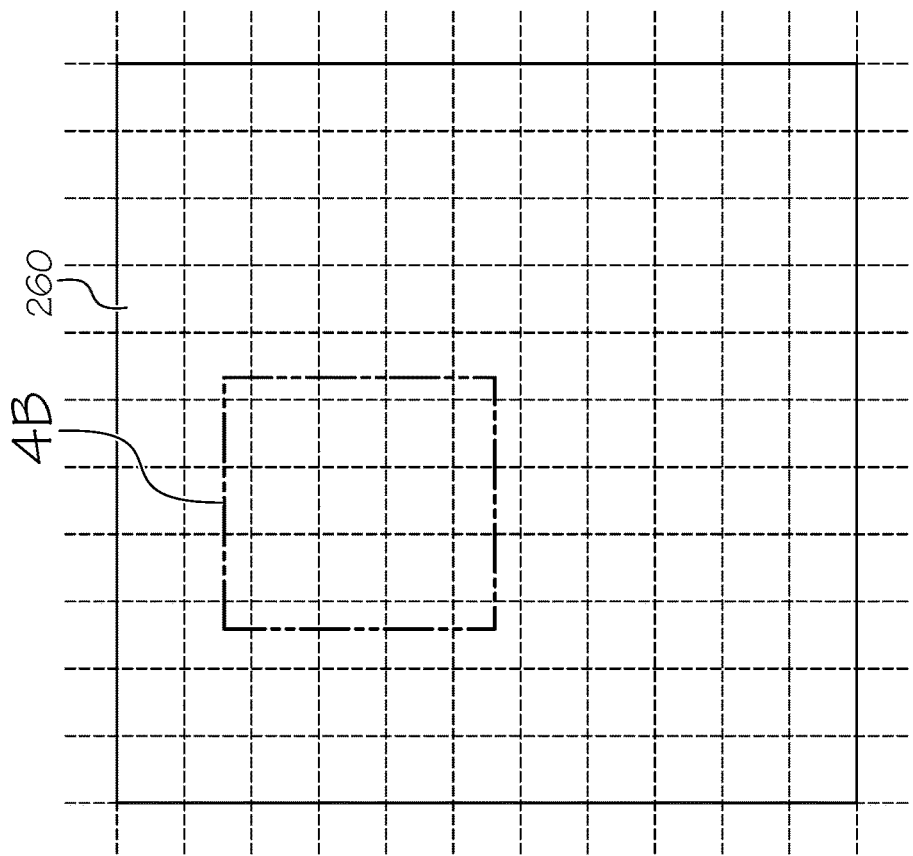
FIG. 4B
FIG. 4A

PACKAGES WITH BACKSIDE MOUNTED DIE AND EXPOSED DIE INTERCONNECTS AND METHODS OF FABRICATING THE SAME

FIELD

The present disclosure is directed to semiconductor devices, and more particularly, to semiconductor device packaging.

BACKGROUND

Power semiconductor devices, such as power amplifiers, are used in a variety of applications such as base stations for wireless communication systems, multi-stage and multiple-path amplifiers (e.g., Doherty amplifiers), etc. The signals amplified by power amplifiers often include signals that have a modulated carrier having frequencies in the megahertz (MHz) to gigahertz (GHz) range. For example, electrical circuits requiring high power handling capability while operating at high frequencies, such as R-band (0.5-1 GHz), S-band (3 GHz), X-band (10 GHz), Ku-band (12-18 GHz), K-band (18-27 GHz), Ka-band (27-40 GHz) and V-band (40-75 GHz) have become more prevalent. In particular, there is now a high demand for radio frequency ("RF") transistor amplifiers that are used to amplify RF signals at frequencies of, for example, 500 MHz and higher (including microwave frequencies).

Many power amplifier designs utilize semiconductor switching devices as amplification devices. Examples of these switching devices include power transistor devices, such as MOSFETs (metal-oxide semiconductor field-effect transistors), DMOS (double-diffused metal-oxide semiconductor) transistors, HEMTs (high electron mobility transistors), MESFETs (metal-semiconductor field-effect transistors), LDMOS (laterally-diffused metal-oxide semiconductor) transistors, etc. A power amplifier may also include passive matching networks at the input and output nodes of the active power transistor devices.

The transistor devices are typically formed as semiconductor integrated circuit chips. Transistor devices may be implemented, for example, in silicon or using wide bandgap semiconductor materials (i.e., having a band-gap greater than 1.40 eV), such as silicon carbide ("SiC") and Group III nitride materials. As used herein, the term "Group III nitride" refers to those semiconducting compounds formed between nitrogen and the elements in Group III of the periodic table, usually aluminum (Al), gallium (Ga), and/or indium (In). The term also refers to ternary and quaternary compounds, such as AlGaN and AlInGaN. These compounds have empirical formulas in which one mole of nitrogen is combined with a total of one mole of the Group III elements.

Silicon-based RF transistor amplifiers may typically be implemented using LDMOS transistors, and can exhibit high levels of linearity with relatively inexpensive fabrication. Group III nitride-based RF amplifiers may typically be implemented using HEMTs, primarily in applications requiring high power and/or high frequency operation where LDMOS transistor amplifiers may have inherent performance limitations.

RF transistor amplifiers may include one or more amplification stages, with each stage typically implemented as a transistor amplifier. In order to increase the output power and current handling capabilities, RF transistor amplifiers are typically implemented in a "unit cell" configuration in which a large number of individual "unit cell" transistors are electrically connected (e.g., in parallel). An RF transistor amplifier may be implemented as a single integrated circuit chip or "die," or may include a plurality of dies. A die or chip may include a small block of semiconducting material or other substrate in which electronic circuit elements are fabricated. For example, a plurality of individual power transistor devices may be formed on a relatively large semiconductor substrate (e.g., by growing epitaxial layers there on doping selected regions with dopants, forming insulation and metal layers thereon, etc.) and the completed structure may then be cut or singulated (e.g., by a sawing or dicing operation) into a plurality of individual die. When multiple RF transistor amplifier dies are used, they may be connected in series and/or in parallel.

RF transistor amplifiers often include matching circuits, such as impedance matching circuits, that are designed to improve the impedance match between the active transistor die (e.g., including MOSFETs, HEMTs, LDMOS, etc.) and transmission lines connected thereto for RF signals at the fundamental operating frequency, and harmonic termination circuits that are designed to at least partly terminate harmonic products that may be generated during device operation such as second and third order harmonic products. The termination of the harmonic products also influences generation of intermodulation distortion products.

The RF amplifier transistor die(s) as well as the impedance matching and harmonic termination circuits may be enclosed in a device package. Integrated circuit packaging may refer to encapsulating one or more dies in a supporting case or package (e.g., overmold or open cavity packages) that protects the dies from physical damage and/or corrosion, and supports the electrical contacts for connection to external circuits. The input and output impedance matching circuits in an integrated circuit device package typically include LC networks that provide at least a portion of an impedance matching circuit that is configured to match the impedance of the active transistor die to a fixed value. The package may include electrical leads to electrically connect the RF amplifier to external circuit elements, such as input and output RF transmission lines and bias voltage sources.

Some conventional methods for assembling RF power devices may involve assembling the transistor die and some of the matching network components in a ceramic or overmolded package on a laminate or flange. The transistor die, capacitors, and input/output leads may be interconnected with wires, such as gold and/or aluminum wires. The wirebond-based connections of some conventional semiconductor device packages may introduce or contribute to several problems. For example, as operating frequencies increase (e.g., above about 5 GHz), parasitic effects of the wirebonds may result in variability in inductance, thereby affecting design and/or effectiveness of the matching circuits. Such wirebond-based assembly processes may also be slow and sequential (e.g., one package bonded at a time), and assembly costs may be high (e.g., due to cost of gold wires and expensive wire-bond machines).

SUMMARY

According to some embodiments, a method of fabricating a semiconductor device includes forming a protective structure on at least one die on a substrate, where the protective structure exposes one or more electrical contacts on a first surface of the at least one die, and forming respective terminals on the one or more electrical contacts exposed by the protective structure.

In some embodiments, a second surface of the at least one die is attached to the substrate with a die attach material therebetween, where the second surface is opposite the first surface.

In some embodiments, the die attach material and the substrate comprise respective thermally conductive materials.

In some embodiments, the substrate comprises a thermally insulating material or semi-insulating material.

In some embodiments, the at least one die comprises a passivation layer on the first surface having one or more openings therein that expose the one or more electrical contacts, and the protective structure exposes the passivation layer.

In some embodiments, the protective structure comprises a mold structure.

In some embodiments, n forming the protective structure comprises a film assisted molding process where a film covers the one or more electrical contacts during formation of the mold structure.

In some embodiments, after forming the respective terminals, the substrate is singulated to define a plurality of semiconductor devices, such that each of the semiconductor devices comprises one or more of the at least one die.

In some embodiments, the substrate has one or more dimensions of about 8 inches to about 12 inches.

In some embodiments, forming the respective terminals comprises forming conductive bumps or conductive pillar structures on the one or more electrical contacts.

In some embodiments, the at least one die is provided on an interconnect structure, where the respective terminals are electrically connected to conductive patterns of the interconnect structure.

In some embodiments, the at least one die is mounted on the interconnect structure in a flip chip configuration in which the respective terminals on the first surface of the at least one die are facing the interconnect structure.

In some embodiments, the at least one die is on a first surface of the interconnect structure, and a second surface of the interconnect structure is opposite the first surface and is configured to be mounted on an external device.

In some embodiments, the second surface of the interconnect structure comprises input and output connections for a semiconductor device package.

In some embodiments, a support material is formed between the first surface of the at least one die and the interconnect structure. The support material extends from the respective terminals to a periphery of the protective structure.

In some embodiments, the at least one die comprises one or more active transistor devices having gate, source, or drain connections coupled to the respective terminals.

In some embodiments, at least one of the gate, source, or drain connections is on a second surface of the at least one die opposite the first surface, and is coupled to one or more conductive via structures that extend through the at least one die.

In some embodiments, the at least one die comprises one or more passive electrical components.

According to some embodiments, a method of fabricating a semiconductor device package includes forming a protective structure on at least one die, where the protective structure exposes a first surface of the at least one die, forming respective terminals on the first surface of the at least one die exposed by the protective structure, and mounting the first surface of the at least one die on an interconnect structure in a flip chip configuration where the respective terminals are facing the interconnect structure and are electrically connected to conductive patterns thereof.

In some embodiments, a support material is formed between the first surface of the at least one die and the interconnect structure, where the support material extends from the respective terminals to a periphery of the protective structure.

In some embodiments, the support material comprises an underfill material.

In some embodiments, a second surface of the at least one die is attached to a substrate with a die attach material therebetween, where the second surface is opposite the first surface.

In some embodiments, the protective structure is a first protective structure, and a second protective structure is formed on the interconnect structure and the substrate.

In some embodiments, the second protective structure comprises a lid member defining an open cavity on the interconnnect structure.

In some embodiments, the second protective structure comprises a mold structure.

In some embodiments, the support material comprises a portion of the mold structure.

In some embodiments, the die attach material and the substrate comprise respective thermally conductive materials, and the second protective structure exposes at least a portion of the substrate.

In some embodiments, forming the second protective structure comprises a laser ablation process or a mechanical grinding process that removes a portion thereof to expose the at least a portion of the substrate.

In some embodiments, the protective structure comprises a mold structure.

In some embodiments, forming the protective structure comprises a film assisted molding process where a film covers the one or more electrical contacts during formation of the mold structure.

In some embodiments, forming the respective terminals comprises forming conductive bumps or conductive pillar structures on one or more electrical contacts on the first surface.

In some embodiments, the at least one die is on a first surface of the interconnect structure, and a second surface of the interconnect structure is opposite the first surface and is configured to be mounted on an external device.

In some embodiments, the second surface of the interconnect structure comprises input and output connections for the semiconductor device package.

According to some embodiments, a semiconductor device package includes a substrate, at least one die comprising a first surface having respective terminals thereon, and a second surface that is on the substrate, a protective structure on the at least one die and the substrate, where the protective structure exposes the respective terminals on the first surface of the at least one die. and a support material on the first surface of the at least one die, where the support material extends from the respective terminals to a periphery of the protective structure.

In some embodiments, the support material comprises an underfill layer.

In some embodiments, the package includes an interconnect structure having the at least one die thereon, where the respective terminals are electrically connected to conductive patterns of the interconnect structure.

In some embodiments, the first surface of the at least one die is on the interconnect structure in a flip chip configuration where the respective terminals are facing the interconnect structure.

In some embodiments, the protective structure is a first protective structure, and a second protective structure is provided on the interconnect structure and the substrate.

In some embodiments, the second protective structure comprises a lid member defining an open cavity on the interconnnect structure.

In some embodiments, the second protective structure comprises a mold structure.

In some embodiments, the support material comprises a portion of the mold structure.

In some embodiments, the substrate comprises a thermally conductive material, and the second protective structure exposes at least a portion of the substrate.

In some embodiments, the at least one die comprises one or more active transistor devices having gate, source, or drain connections coupled to the respective terminals.

In some embodiments, the at least one die comprises one or more passive electrical components.

In some embodiments, the at least one die is a Group III nitride- or silicon carbide-based RF transistor amplifier die.

In some embodiments, an operating frequency of the RF transistor amplifier is in the R-band, S-band, X-band, Ku-band, K-band, Ka-band, and/or V-band.

Other devices, apparatus, and/or methods according to some embodiments will become apparent to one with skill in the art upon review of the following drawings and detailed description. It is intended that all such additional embodiments, in addition to any and all combinations of the above embodiments, be included within this description, be within the scope of the invention, and be protected by the accompanying claims.

BRIEF DESCRIPTION OF THE DRAWINGS

FIGS. 4A, 4B, 4C, 4D, 4E, and 4F are schematic plan views illustrating methods of fabricating semiconductor devices according to some embodiments of the present disclosure.

DETAILED DESCRIPTION

Figure 1A:
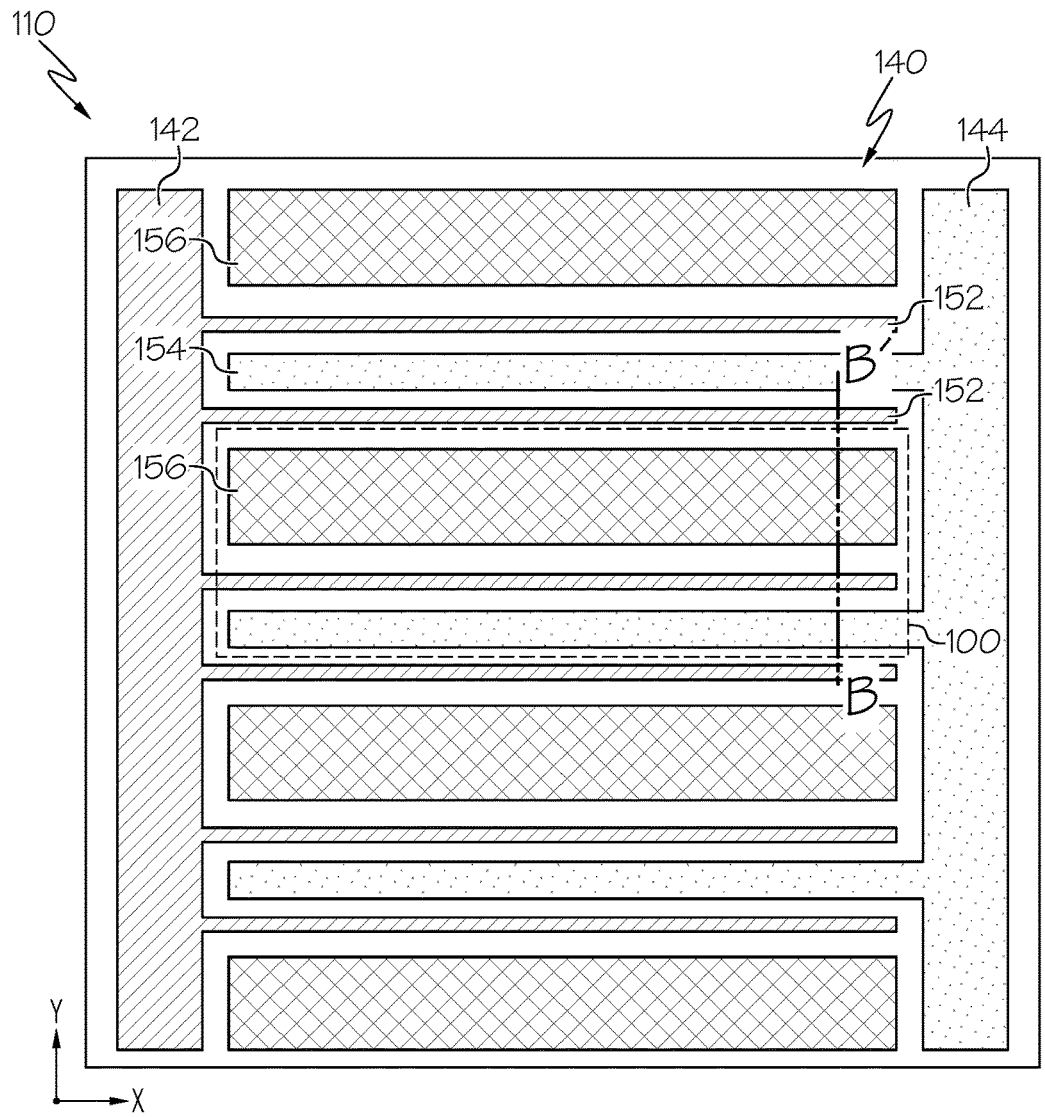
FIG. 1A is a schematic plan view that shows the structure of the top metallization of a power semiconductor device in accordance with some embodiments of the present disclosure, shown by way of example as a high electron mobility transistor.

In the following detailed description, numerous specific details are set forth to provide a thorough understanding of embodiments of the present disclosure. However, it will be understood by those skilled in the art that the present disclosure may be practiced without these specific details. In some instances, well-known methods, procedures, components, and circuits have not been described in detail so as not to obscure the present disclosure. It is intended that all embodiments disclosed herein can be implemented separately or combined in any way and/or combination. Aspects described with respect to one embodiment may be incorporated in different embodiments although not specifically described relative thereto. That is, all embodiments and/or features of any embodiments can be combined in any way and/or combination.

As noted above, wirebond-based connections of some conventional semiconductor device packages may introduce or contribute to several problems. For example, as operating frequencies increase (e.g., above 5 to 6 GHz) parasitic effects of the wirebonds may result in variability in inductance, thereby affecting design and/or effectiveness of matching networks. In addition, high levels of heat may be generated within the semiconductor die(s) during operation. If the die(s) become too hot, the performance (e.g., output power, efficiency, linearity, gain, etc.) of the amplifier may deteriorate and/or the die(s) may be damaged.

Some embodiments of the present invention may arise from realization that flip-chip configurations may help alleviate the above and other problems. As used herein, "flip chip" may refer to a configuration in which pads or terminals of a transistor die or other circuit components are electrically connected by conductive bumps or pillars (rather than by wirebonds), which can allow for stacked or vertical connections with one or more other circuit elements. For example, a transistor die may have one or more gate terminals, drain terminals, and source terminals located on the same side or surface of the transistor die adjacent the active conduction channel (also referred to herein as the active surface of the die), which is opposite the inactive surface (also referred to herein as the back surface) of the die. The die may be "flipped" onto an underlying interconnect structure (i.e., with the active surface of the die facing toward the interconnect structure, and the opposing inactive surface of the die facing away from the interconnect structure) such that one or more terminals on the active surface are electrically connected to the conductive patterns of the interconnect structure.

As such, bond wires may not be required for the gate and drain connections, which may reduce an amount of inductance present in the circuit and thus reduce parasitic effects relating to the package and connections. In addition, providing the terminals for electrical connections at the active or front surface of the die for mounting in a flip-chip configuration may allow for heat conduction paths away from an external device, such as a circuit board or other customer application.

Embodiments of the present invention are directed to packaging technologies for semiconductor dies (e.g., silicon (Si), silicon carbide (SiC), or gallium nitride (GaN) on SiC transistor dies and/or dies including passive electrical components) that provide a protective structure (e.g., a mold structure) around one or more dies that are provided on a leadframe or flange or other substrate, such that the die pads or other electrical contacts of the semiconductor die(s) are exposed. Electrical interconnects (referred to herein as connection terminals or simply terminals) are provided on the electrical contacts exposed by the protective structure. The terminals may be implemented by conductive pillars (e.g., copper pillars) and/or conductive bumps (e.g., solder bumps). The resulting semiconductor devices may thereby include active and/or passive dies integrated on a substrate or flange and protected by a mold or other protective member, which may be packaged to provide a semiconductor device package, or may be mounted onto an external device (e.g., a customer circuit board), in some embodiments in a flip chip configuration.

Figure 1B:
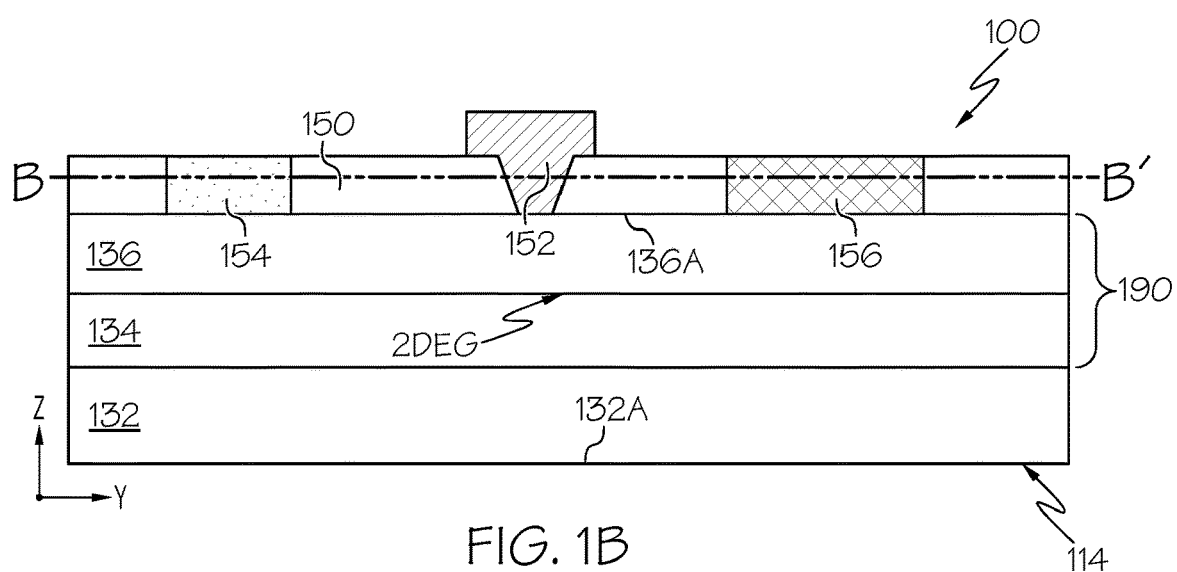
FIG. 1B is a schematic cross-sectional view taken along line B-B' of FIG. 3A that shows the structure of a unit cell transistor of FIG. 3A.

FIG. 1A is a schematic plan view that shows the structure of the top metallization of a semiconductor die 110 in accordance with some embodiments of the present disclosure, shown by way of example as a high electron mobility transistor (HEMT) die. FIG. 1B is a schematic cross-sectional view taken along line B-B' of FIG. 1A that shows the structure of a unit cell transistor of FIG. 1A. While described herein with reference to HEMTs by way of example, it will be understood that embodiments of the present disclosure are not limited to any particular transistor type, and may include, for example, metal-oxide-semiconductor field effect transistor (MOSFET) embodiments, such as laterally diffused MOSFETs (LDMOS) embodiments.

As shown in FIGS. 1A and 1, a transistor device or die 110 may include multiple transistor unit cells or structures 100 that are connected in parallel to device terminals or electrodes (e.g., an input terminal, an output terminal, and a ground terminal). For example, each of the gate 152, drain 154, and source 156 contacts may extend in a first direction (e.g., the X-direction) to define gate, drain, and/or source 'fingers', which may be connected by one or more respective buses (e.g., by a gate bus and a drain bus adjacent the upper or active surface 136A of the semiconductor structure 190). In particular, the gate fingers 152 are electrically connected to a common gate manifold 142, and the drain fingers 154 are electrically connected to a common drain manifold 144. The gate manifold or bus 142 is electrically connected to a gate terminal 222, which may be implemented as one or more conductive bumps or pillars, and the drain manifold or bus 144 is electrically connected to the drain terminal 224, which may be implemented as one or more conductive pillars or bumps (as described herein with reference to FIGS. 2A and 2B). The source fingers 156 are electrically connected to the source terminal 226 (which may be implemented by one or more conductive bumps or pillars) and/or to a source bus 146. Electrical contacts 145 (e.g., die pads; see FIGS. 2A and 2B) on one or more surfaces of the die 110 may be connected to the gate, drain, and source buses 142, 144, and 146, respectively.

In FIG. 1A, the gate fingers 152, drain fingers 154, and source fingers 156 extend in parallel to each other, with the gate fingers 152 extending from the gate bus 142 in a first direction and the drain fingers 154 extending from the drain bus 144 in a direction opposite the first direction. Each gate finger 152 may be positioned between a drain finger 154 and a source finger 156 to define the unit cell 100. The gate fingers 152, drain fingers 154, and source fingers 156 (and connecting buses) may define part of gate-, drain-, and source-connected electrodes of the device, respectively, as defined by the top side metallization structure 140. Since the gate fingers 152 are electrically connected to a common gate bus 142, the drain fingers 154 are electrically connected to a common drain bus 144, and the source fingers 156 are electrically connected together, it can be seen that the unit cell transistors 100 are electrically connected together in parallel. One of the terminals of the device (e.g., a source terminal 226 or bus 146 connected to the source contact(s) 156) may be configured to be coupled to a reference signal such as, for example, an electrical ground.

As shown in FIG. 1B, the semiconductor die 110 may be formed on a substrate 132 such as, for example, a SiC, Si, or sapphire substrate, which may include the back or inactive surface 132A that provides a heat dissipation surface HD in some embodiments. With reference to the unit cell structure 100 of FIG. 1B, a channel layer 134 is formed on the substrate 132. A barrier layer 136 is formed on the channel layer 134 opposite the substrate 132. The channel layer 134 may include, for example, gallium-nitride (GaN) and the barrier layer 126 may include, for example, aluminum gallium-nitride (AlGaN). The channel layer 134 and barrier layer 136 may together form a semiconductor layer structure 190 on the substrate 132. A source contact 156 and a drain contact 154 are formed on an upper surface of the barrier layer 136 and are laterally spaced apart from each other. The source contact 156 and the drain contact 154 may form an ohmic contact to the barrier layer 136.

A gate contact 152 is formed on the upper surface of the barrier layer 126 between the source contact 156 and the drain contact 154. A two-dimensional electron gas (2DEG) layer is formed at a junction between the channel layer 134 and the barrier layer 136 when the HEMT device 110 is biased to be in its conducting or "on" state. The 2DEG layer acts as a highly conductive layer that allows current to flow between the source and drain regions of the device that are beneath the source contact 156 and the drain contact 154, respectively. The source contact 156 may be coupled to a reference signal such as, for example, a ground voltage.

In some embodiments, one or more insulating layers 150 may directly contact the upper surface of the semiconductor structure 190 (e.g., contact the upper surface 136A of the barrier layer 136). The one or more insulating layers 150 may serve as passivation layers for the device 110. Electrical contacts 145 may be electrically coupled to the gate contact 152, the drain contact 154, and/or the source contact 156. Die interconnection structures or terminals 225 (e.g., conductive pillars or conductive bumps) may protrude from the front surface 112 of the die 110 to provide electrical connections between the gate contact 152, the drain contact 154, and/or the source contact 156 and an external device or module. Dielectric layers that isolate the various conductive elements of the top-side metallization structure 140 from each other are not shown in FIG. 1A to simplify the drawing. It will be appreciated that FIGS. 1A and 1B (and various of the other figures) are highly simplified diagrams and that actual semiconductor devices may include many more unit cells and various circuitry and elements that are not shown in the simplified figures herein.

Figure 2A:
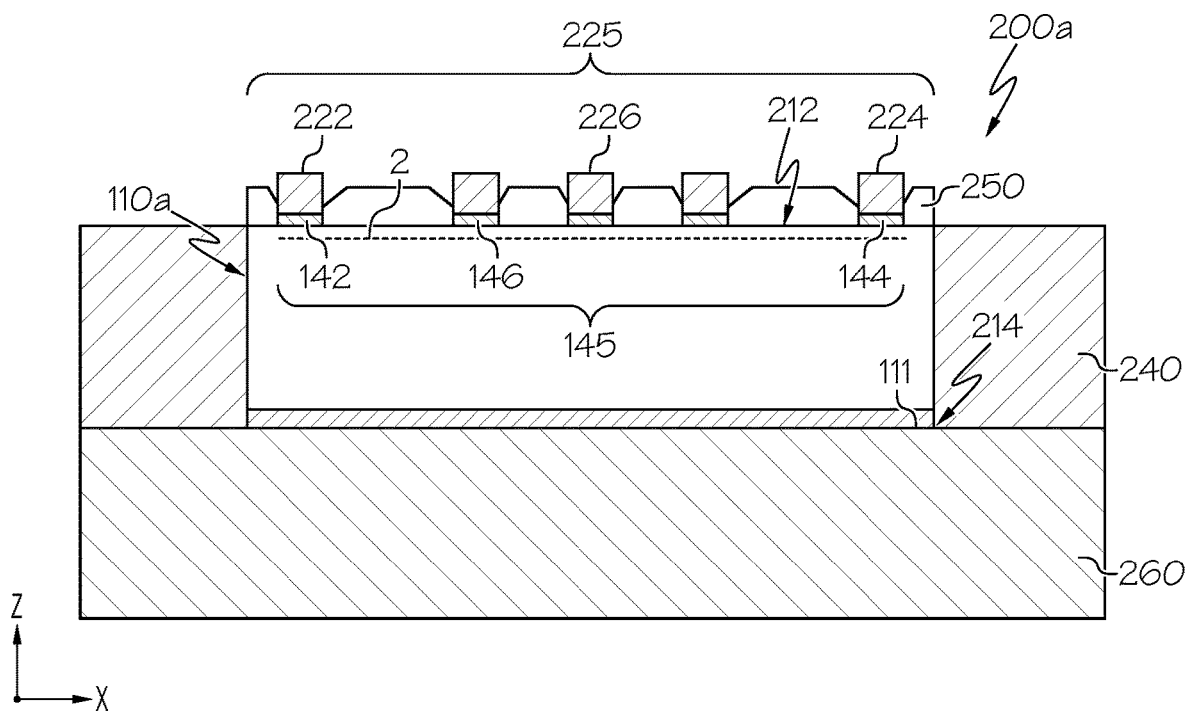
FIGS. 2A and 2B are schematic cross-sectional views illustrating examples of semiconductor devices in accordance with some embodiments of the present disclosure.
Figure 2B:
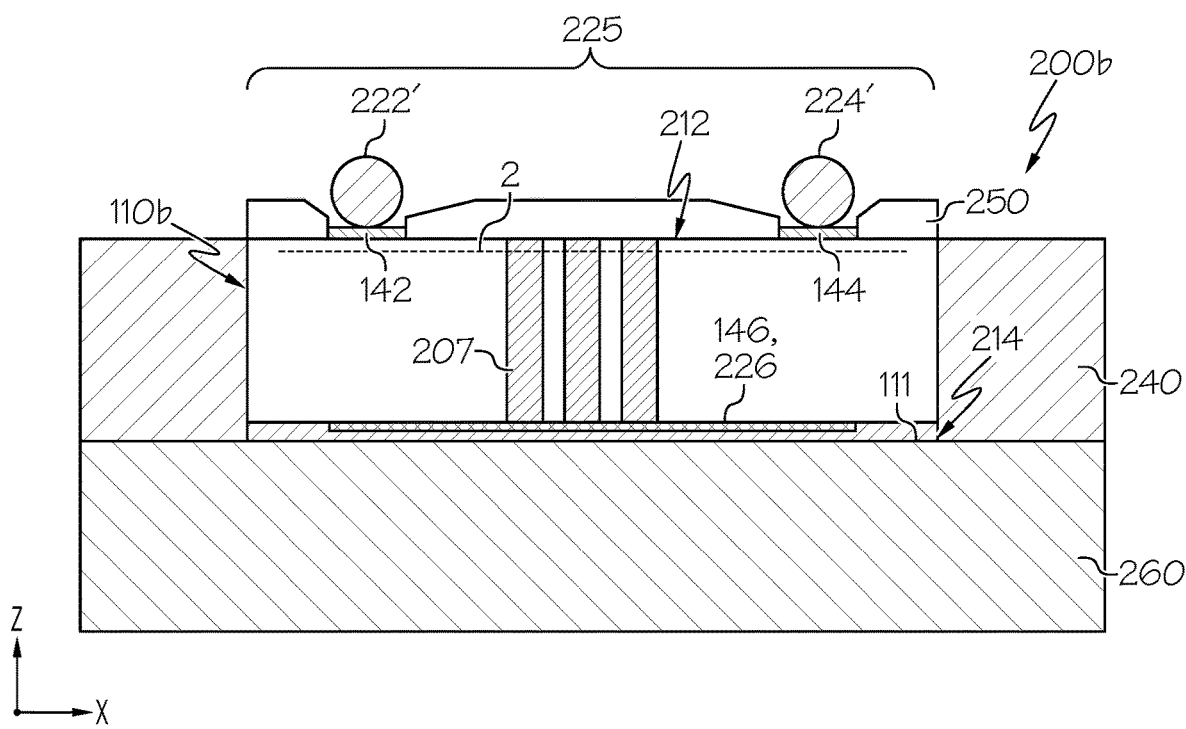

FIGS. 2A and 2B are schematic cross-sectional views illustrating examples of semiconductor devices 200a and 200b including active transistor dies 110a and 110b (collectively, 110) on a carrier substrate 260, where a protective structure 240 exposes one or more electrical contacts 145 or terminals 225 of the dies 110 in accordance with some embodiments of the present disclosure. The carrier substrate 260 may be configured to provide a leadframe or flange for the semiconductor devices 200a, 200b.

The substrate 260 may be a base frame or flange formed of various materials. In some embodiments, the substrate 260 may include one or more metals or other thermally conductive materials. For example, the substrate 260 may be a CPC (copper, copper-molybdenum, copper laminate structure) or copper flange. In some embodiments, the substrate 260 may include a metal heat sink that is part of a lead frame or metal slug. The substrate 260 can thus provide improved thermal dissipation of the heat generated by the die 110 when assembled in a semiconductor device package, such as those described below with reference to FIGS. 7A to 8B. For example, the substrate 260 may provide package level heat slug that is configured to pull heat away from the die 110 and toward an external heat sink. In some package configurations, the carrier substrate 260 also serves as an electrical terminal that provides a reference potential (e.g., ground) to the dies that are mounted thereon. In other embodiments, the substrate 260 may include one or more thermally insulating or semi-insulating materials (e.g., Si or SiC) or other materials that may be used in semiconductor processing.

FIG. 2A illustrates an example semiconductor device 200a in which the terminals 225 of the die 110a are implemented as conductive pillar structures 222, 224, 226, which protrude from the first or active surface 212 (adjacent the active channel 2 (e.g., the 2DEG layer)) of the die 110a, and the second or inactive surface 214 of the die 110a is mounted on the substrate 260. FIG. 2B illustrates an example semiconductor device 200b in which some of the terminals 225 (e.g., the gate and drain terminals) of the die 110b are implemented as conductive bumps 222', 224' that protrude from the first or active surface 212 of the die 110b, and at least one other terminal 225 (e.g., the source terminal 146, 226) is on the second or inactive surface 214 of the die 110b and is coupled to one or more conductive via structures 207 that extend through the die 110b to provide connections to the active surface 212. Various other combinations of terminals 225 implemented by conductive pillars and/or bumps on the first and/or second surfaces of the dies 110 may be used in accordance with embodiments of the present disclosure.

As shown in FIGS. 2A and 2B, the second or inactive surface 214 of the dies 110 is attached to the substrate 260 by a die attach material 111. The die attach material 111 may be a thermally conductive die attach layer, such as a eutectic layer, or other thermally conductive adhesive layer. In some embodiments, the semiconductor devices 200a and 200b may be "flipped" (relative to the orientations shown in FIGS. 2A and 2B) and attached to packaging structures or external circuit boards with the terminals 222, 224, and 226 on one side 212 of the die 210 facing "down" and the growth substrate on the opposite side 214 facing "up," i.e., in a flip-chip configuration. In some embodiments a support material (121 herein), such as an underfill material or another encapsulant material, mechanically supports the terminals 225 and/or the protective structure 240 along an interface with other packaging components or external devices.

Still referring to FIGS. 2A and 2B, an encapsulating protective structure 240 is formed around the die 210. For example, the protective structure 240 may be a dispensed and cured encapsulant or compound, such as a plastic or a plastic polymer compound, which is formed so as to encapsulate the die(s) 110 and one or more surfaces of the interconnect structure 105 to provide environmental protection for the packages 200a, 200b. The protective structure 240 is formed or otherwise configured to expose the electrical contacts 145 on the first surface of the die(s) 110. The protective structure 240 may have a thickness substantially similar to a thickness of the die 210, and can provide improved mechanical support. In some embodiments, a surface of the protective structure 240 may be substantially coplanar with the front surfaces 212 of the die(s) 110, 130. In some embodiments, the surface of the protective structure 240 may be recessed or protruding relative to the front surfaces 212 of the die(s) 110, 130 facing the interconnect structure 105.

While described in FIGS. 2A and 2B with reference to semiconductor die(s) 110 including active transistors mounted on a surface of a substrate 260 and protected by a protective structure 240, it will be understood that semiconductor die(s) including various passive electrical components (shown in subsequent figures as 130) may be similarly mounted on the surface of substrate 260 and protected by the protective structure 240. The passive electrical component die(s) 130 may include, for example, resistors, inductors, and/or capacitors implemented by discrete devices (e.g., surface mount devices (SMDs) or integrated passive devices (IPDs) with thin film substrates such as silicon, alumina, or glass). The term "die" as used herein may thus refer to active component dies 110 (e.g., transistor dies) or passive component dies 130 (e.g., capacitor chips or IPDs). That is, the example semiconductor devices 200a, 200b may include active die(s) 110 (e.g., Si, Group III-nitride, and/or SiC-based semiconductor dies) or passive dies 130 (e.g., IPDs) or combinations thereof. Also, while illustrated in FIGS. 2A and 2B with reference to specific examples, features of one or more the examples may be combined in some embodiments. For instance, the conductive via structures 207 of FIG. 2B may be used in conjunction with the conductive pillars 225 of FIG. 2A.

FIGS. 3A to 3D are schematic side views illustrating methods of fabricating semiconductor devices according to some embodiments of the present disclosure. FIGS. 4A to 4E are schematic plan views illustrating methods of fabricating semiconductor devices according to some embodiments of the present disclosure. FIG. 5 is a flowchart illustrating operations for fabricating semiconductor devices according to some embodiments of the present disclosure.

Figure 3A:
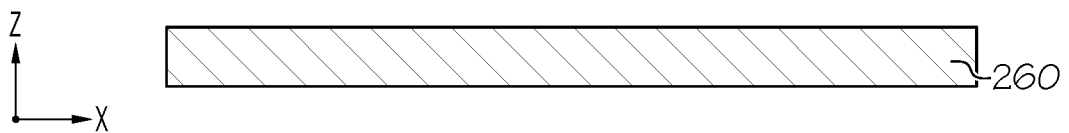
FIGS. 3A, 3B, 3C, and 3D are schematic side views illustrating methods of fabricating semiconductor devices according to some embodiments of the present disclosure.
Figure 4D:
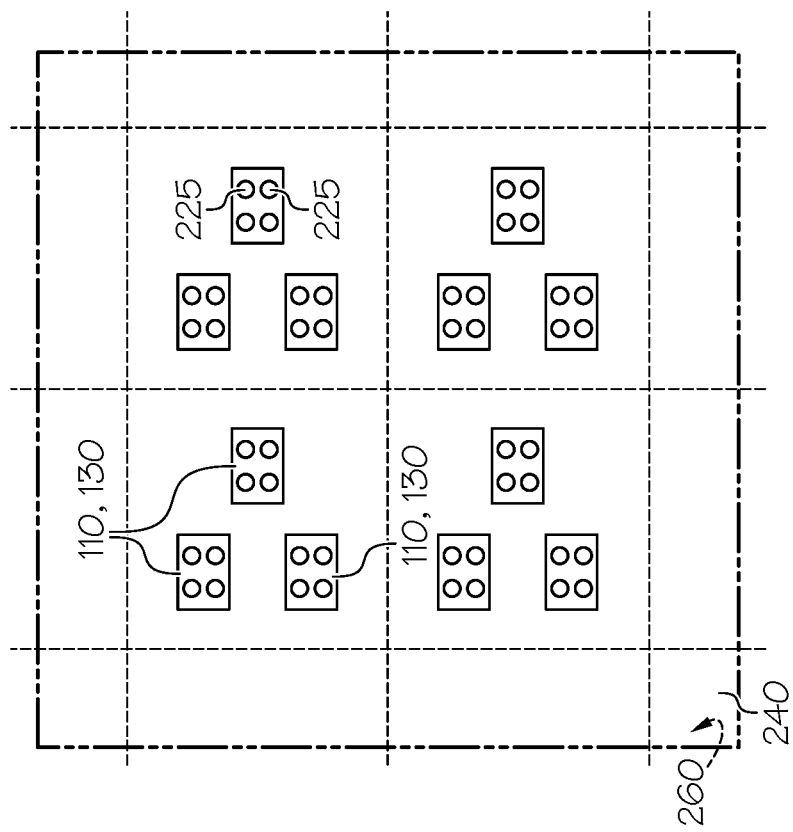

As shown in FIGS. 3A, 4A, and 5, a substrate 260 is provided. The substrate 260 may be a base frame or flange formed of various materials, such as thermally conductive materials (e.g., copper), or thermally insulating or semi-insulating materials (e.g., Si, SiC). The substrate 260 may be configured to provide a leadframe or flange for a single semiconductor device (as shown in FIG. 3A), or may be a sheet or panel (e.g., having a rectangular or elliptical shape in plan view, for compatibility with corresponding semiconductor wafer processing) that is configured to be diced or otherwise singulated into leadframes or flanges for a plurality of semiconductor devices (as shown in FIG. 4A). For example, the substrate 260 may have a shape and one or more dimensions corresponding to a standard (e.g., 8-inch to 12-inch) wafer shape. In some embodiments, the substrate frame or flange 260 may be pre-manufactured to include a plurality of substrates 260 that are connected by tie-bars 261 (as shown in FIG. 4F), which may ease subsequent singulation operations (particularly for metal-based substrates 260) into leadframes or flanges for a plurality of semiconductor devices.

A die attach material 111 (e.g., solder or other adhesive material) is provided on the substrate 260 (or on back surfaces) of the dies 110 and/or 130) at block 505. The die attach material 111 may be thermally conductive in some embodiments.

Figure 3B:
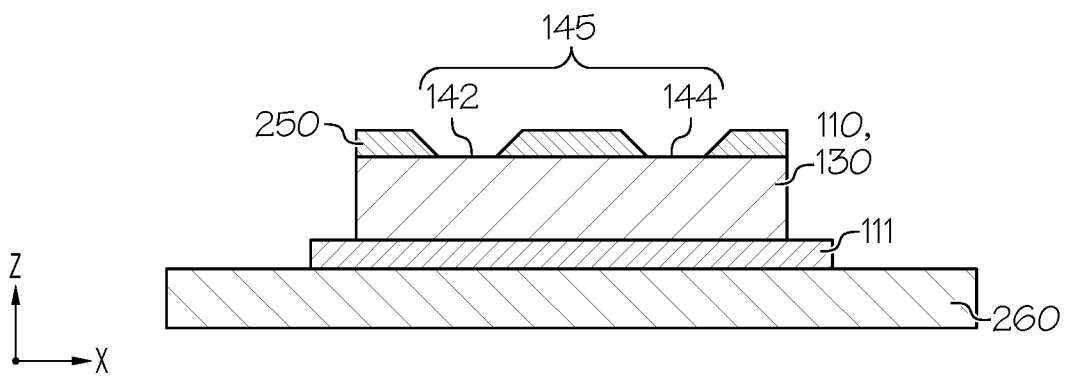

As shown in FIGS. 3B, 4B, and 5, one or more dies 110 and/or 130 are attached to the substrate 260 at block 510. The semiconductor die(s) 110 may be active transistor dies, while the die(s) 130 may include one or more passive electrical components. The semiconductor die(s) 110 may include a passivation layer 250 on a first or front surface thereof. The passivation layer 250 may include one or more openings therein, which expose electrical contacts 145 (e.g., coupled to the gate bus 142 or drain bus 144 of the dies 110) on the first surface of the semiconductor die(s) 110. The second or back surface of the die(s) 110 and/or 130 may be attached to the substrate 260 by the die attach material 111.

Figure 3C:
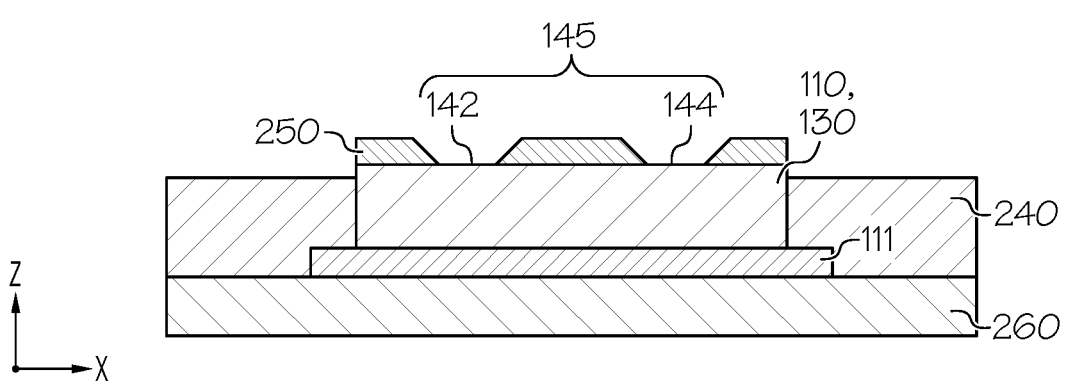
Figure 3D:
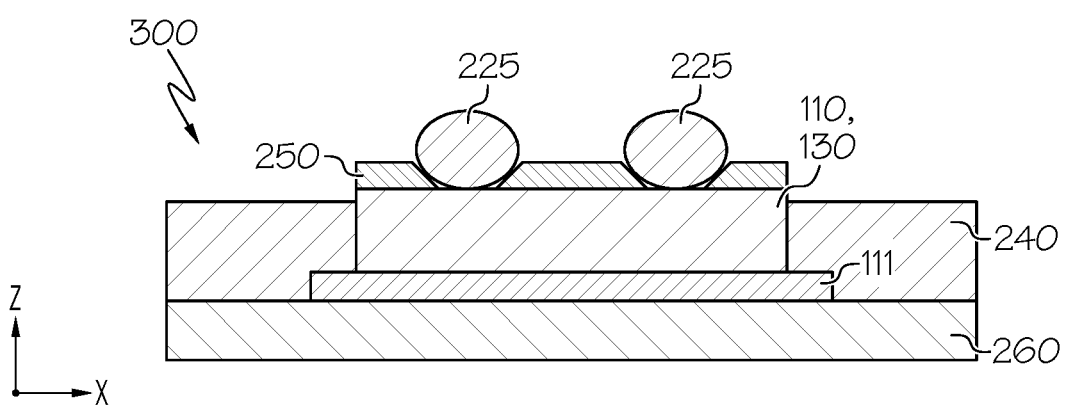
Figure 4C:
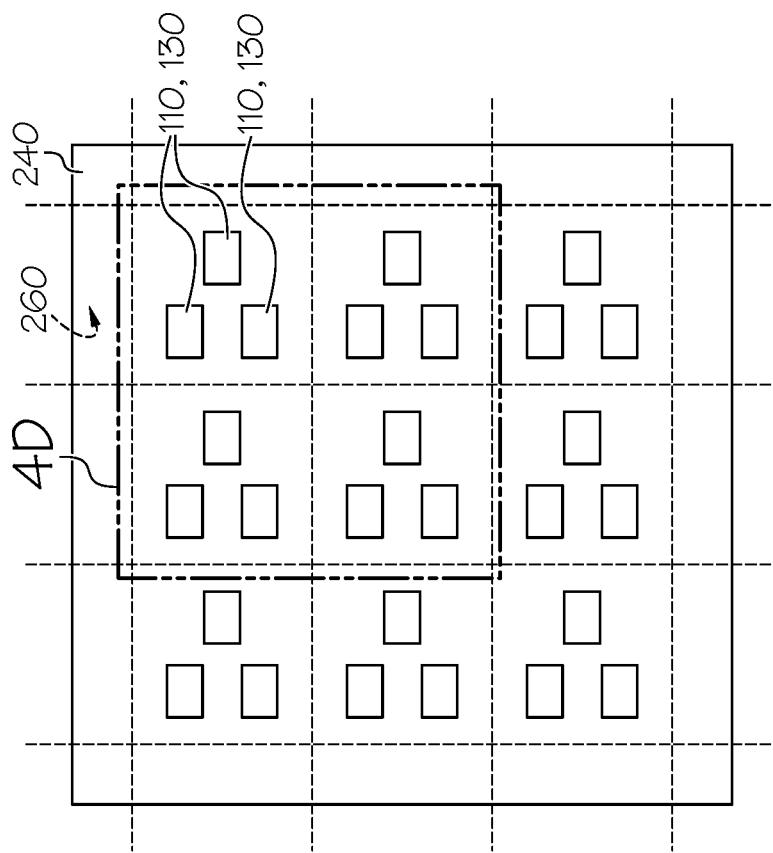
Figure 4E:
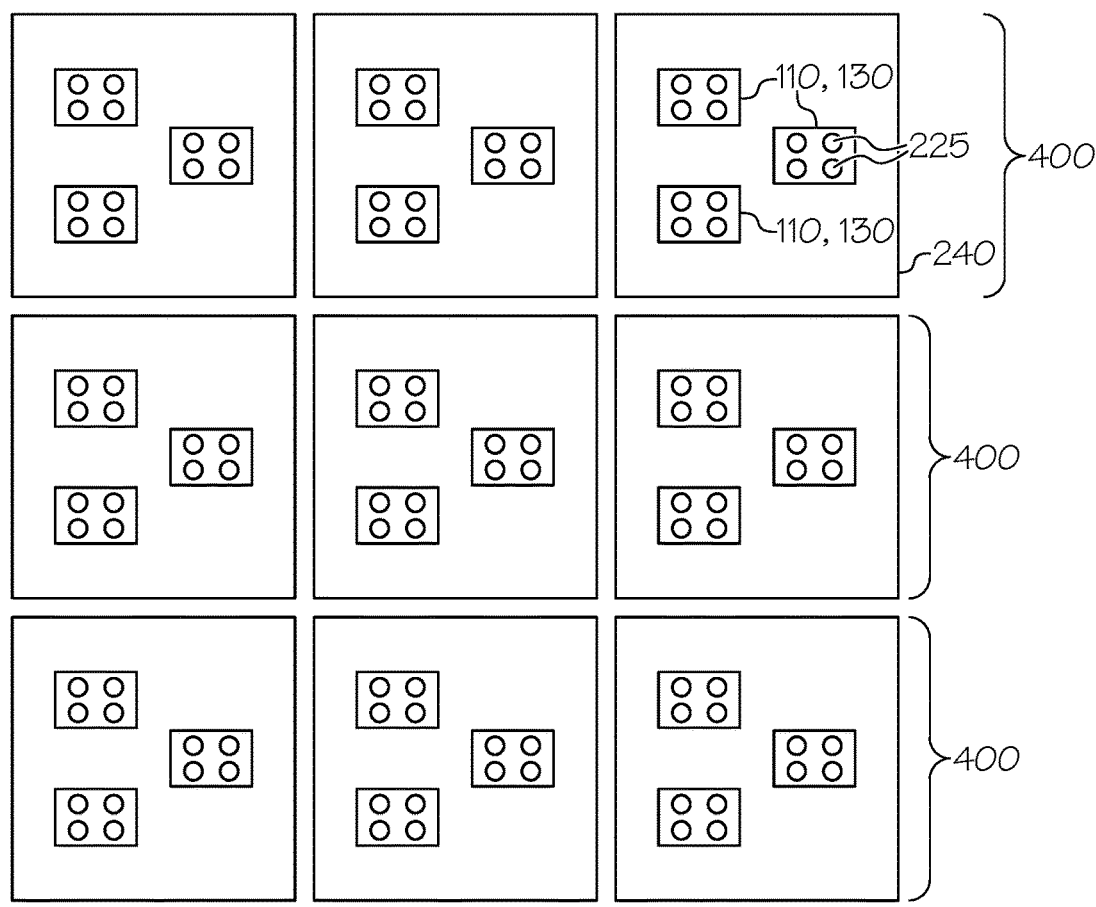
Figure 4F:
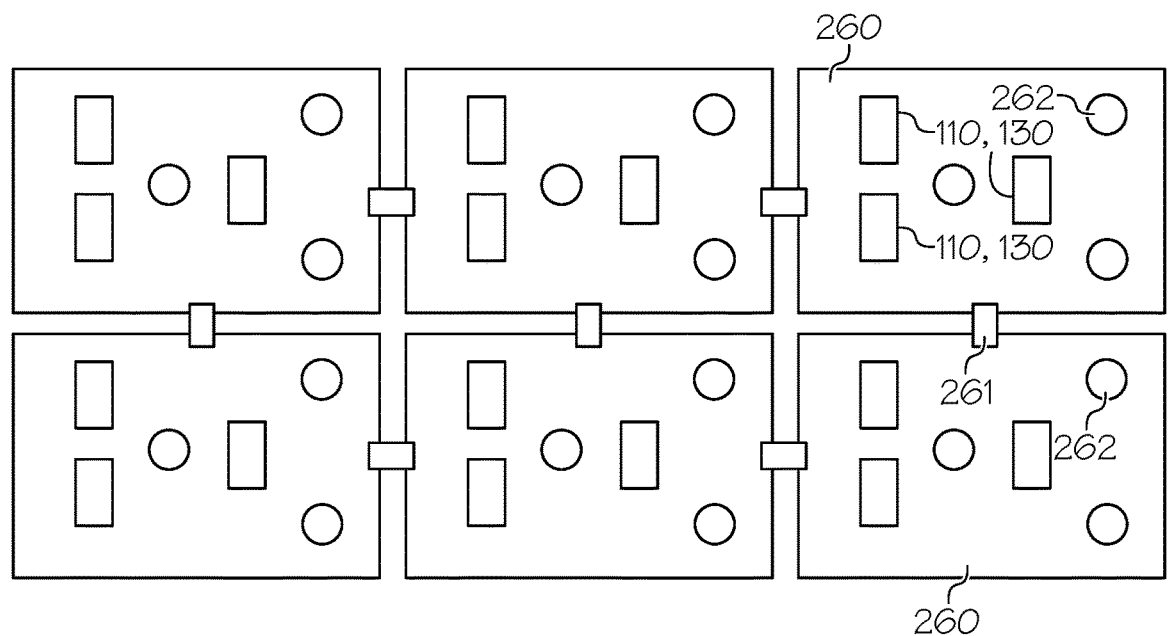
Figure 5:
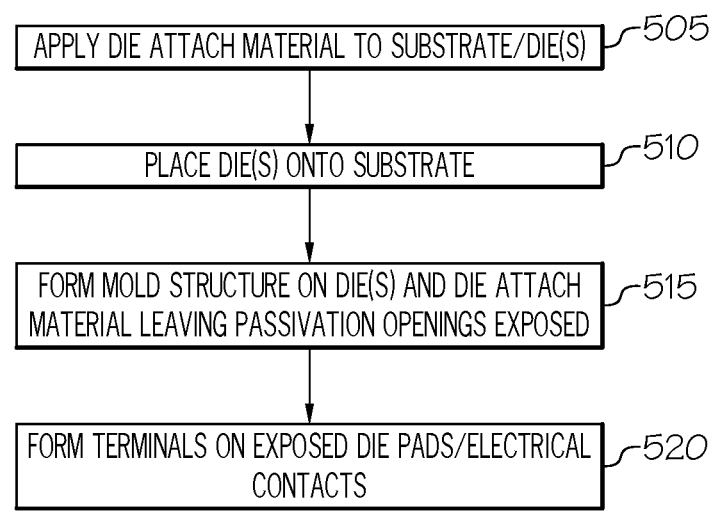
FIG. 5 is a flowchart illustrating operations for fabricating semiconductor devices according to some embodiments of the present disclosure.

As shown in FIGS. 3C, 4C, and 5, a protective structure 240 is formed on the semiconductor die(s) 110 and/or 130 and on the die attach material 111 and the substrate 260 at block 515. The protective structure 240 exposes one or more electrical contacts 145 of the semiconductor die(s) 110 and/or 130. In particular, in the examples of FIGS. 3A to 5, the protective structure 240 is implemented by a mold structure (e.g., a plastic or a plastic polymer compound) that is formed on the substrate 260 and surrounds side surfaces of the semiconductor die(s) 110 and/or 130. In some embodiments, the substrate 260 may include one or more openings or mold lock features 262 that improve adhesion of the mold structure 240 thereon. The protective structure 240 exposes at least a portion of the passivation layer 250 and the electrical contacts 145. For example, the protective structure 240 may be formed by a film assisted molding process in which a film 630 covers the passivation layer 250 and/or the electrical contacts 145 during formation of the mold structure, as described below with reference to FIGS. 6A to 6D.

As shown in FIGS. 3D, 4D, and 5, respective terminals 225 are provided on the electrical contacts 145 exposed by the protective structure 240 (and the openings in the passivation layer 250) at block 520. In some embodiments, the respective terminals 225 may be formed as conductive bumps (e.g., solder balls). In some embodiments, the respective terminals 225 may be formed as conductive pillar structures (e.g., Cu pillars). In the semiconductor die(s) 110, the terminals 225 may be coupled to the gate, source, or drain connections 142, 144, or 146. In the semiconductor die(s) 130, the terminals 225 may be coupled to input or output connections of the passive electrical components. A semiconductor device 300 including one or more backside mounted dies 110 and/or 130 and exposed interconnection terminals 225 may thereby be formed.

As shown in FIG. 4E, in embodiments where the substrate 260 is a panel or sheet structure, the substrate 260 is diced or otherwise singulated after forming the respective terminals 225 on the semiconductor die(s) 110 and/or 130, to define a plurality of semiconductor devices 400. Each of the semiconductor devices 400 includes a portion of the substrate 260 with one or more of the semiconductor die(s) 110 and/or 130 mounted thereon.

FIGS. 6A, 6B, 6C, and 6D are schematic cross-sectional views illustrating methods of fabricating semiconductor devices using a film assisted molding process in accordance with some embodiments of the present disclosure. In the film assisted molding process, a film or tape covers the passivation layer and/or the electrical contacts during formation of the mold structure as the protective structure.

Figure 6A:
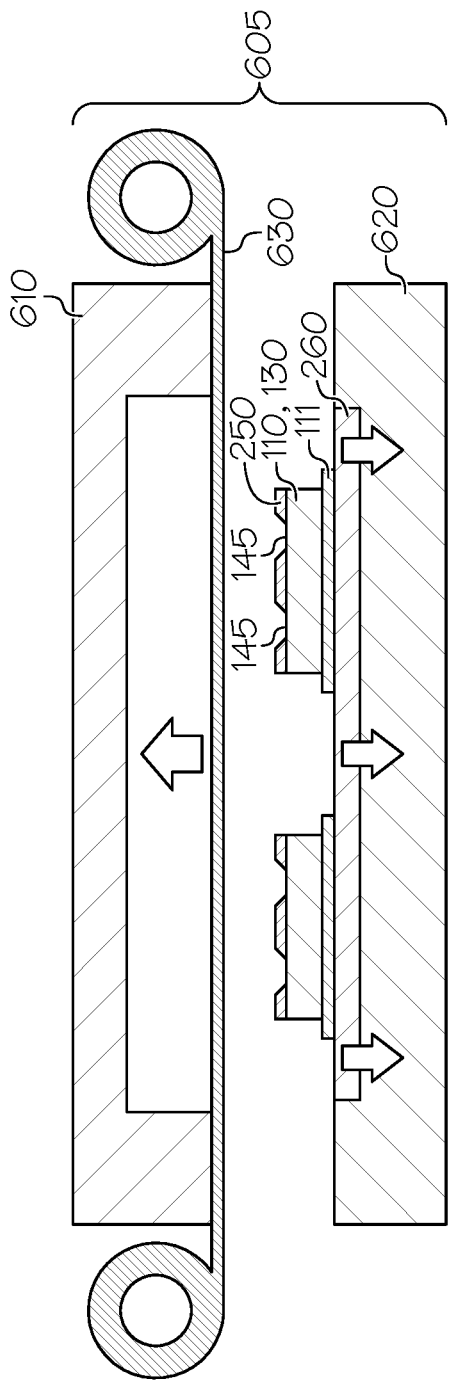
FIGS. 6A, 6B, 6C, 6D, 6E, 6F, 6G, and 6H are schematic cross-sectional views illustrating methods of fabricating semiconductor devices using a film assisted molding process in accordance with some embodiments of the present disclosure.

As shown in FIG. 6A, a mold apparatus 605 including an upper mold chase 610 and a lower mold chase 620 is opened, and one or more substrates 260 (which respectively include one or more dies 110 and/or 130 mounted thereon) are loaded into the mold chase 610, 620. For example, the substrate 260 may be a sheet or panel including groups or sets of dies 110 and/or 130 configured to be singulated into respective semiconductor devices, and may be handled (automatically or manually) into the mold chase 610, 620 and clamped or otherwise secured in the lower mold chase 620, e.g., by vacuum. The upper mold chase 610 includes a film or tape material 630 loaded therein. The film or tape material 630 is pulled toward the upper mold chase 610, e.g., by vacuum, such that the film or tape material 630 may conformally extend along inner surfaces of the upper mold chase 610.

Figure 6B:
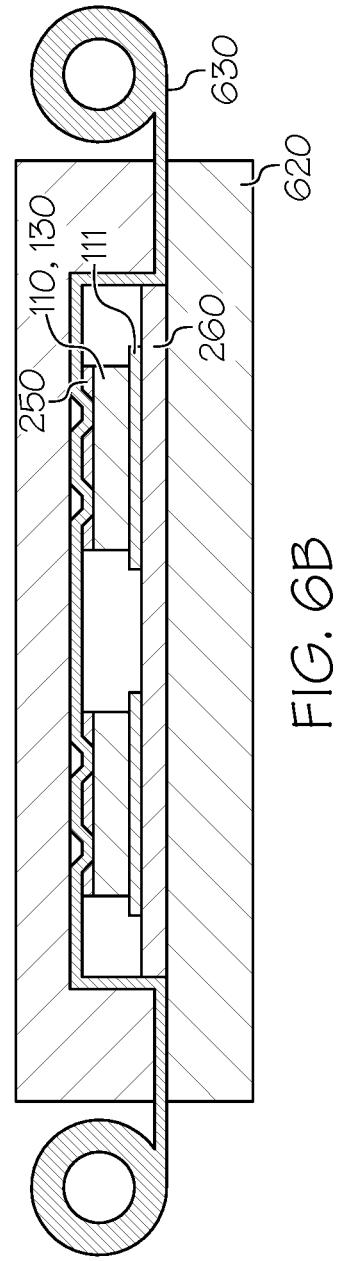

As shown in FIG. 6B, the mold apparatus 605 is closed by clamping together the upper mold chase 610 and the lower mold chase 620, such that an adhesive surface of the film or tape material 630 is pressed onto or otherwise contacts respective surfaces of the dies 110 and/or 130. More particularly, adhesive surface of the film or tape material 630 is pressed onto the passivation layers 250 on the first or upper surfaces of the dies 110 and/or 130. As such, the film or tape material 630 covers the openings in the passivation layer 250, such that the electrical contacts 145 are protected by the film or tape material 630. For example, the film or tape material 630 may conformally extend into the openings in the passivation layer 250 to physically contact the electrical contacts 145.

The film or tape material 630 may have a thickness and/or compressibility that is configured to at least partially compensate for variations in the depths of the openings in the passivation layer 250 and/or for variations in the heights of the dies 110 and/or 130. For example, the film or tape material 630 may be configured to compensate for or allow tolerances of about 20 μm to 50 μm in height variation among the dies 110 and/or 130. In some embodiments, the film or tape material 630 may have a thickness of about 50 μm to 100 μm.

With the mold apparatus 605 closed and the film or tape material 630 contacting upper surfaces of the dies 110 and/or 130 (or surfaces of the passivation layer 250 thereon) opposite the interconnect structure 105, a mold compound (e.g., plastic or polymer compound) is pressed or otherwise introduced into the mold chase to form the protective structure 240. The mold compound covers the surface of the substrate 260 and side surfaces of the dies 110 and/or 130 thereon. The upper surfaces of the dies 110 and/or 130 (or surfaces of the passivation layer 250 thereon) are protected by the film or tape material 630, which prevents formation of the mold compound thereon.

Figure 6C:
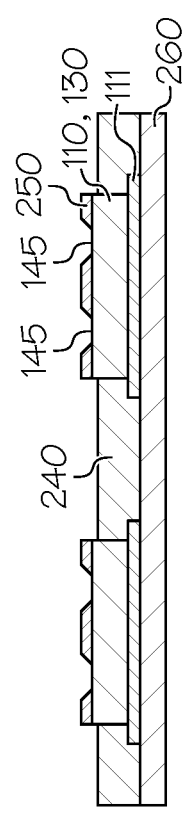
Figure 6D:
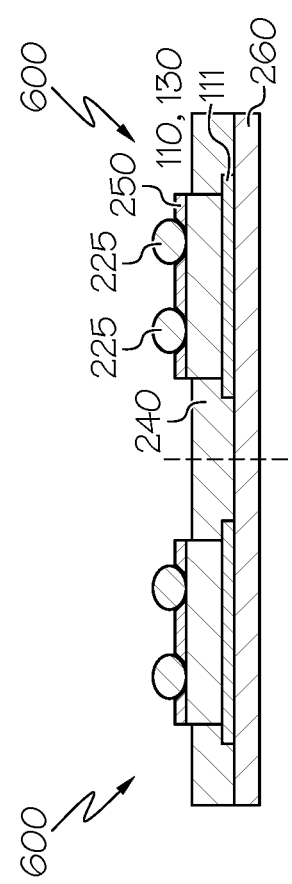

As such, as shown in FIG. 6C, upon removal from the mold apparatus 605, the substrate or panel 260 includes a plurality of dies 110 and/or 130 with passivation layers 250 and electrical contacts 145 on upper surfaces thereof that are exposed by the protective structure 240. In FIG. 6D, respective terminals 225 (shown as conductive bumps) are formed on the electrical contacts 145 exposed by the protective structure 240 (and the openings in the passivation layer 250). In some embodiments, after the operations of FIG. 6D, the substrate or panel 260 may be diced or otherwise singulated to define respective semiconductor devices 600, each including a portion of the protective structure 240, the substrate 260, and one or more of the semiconductor die(s) 110 and/or 130 mounted thereon.

Figure 6E:
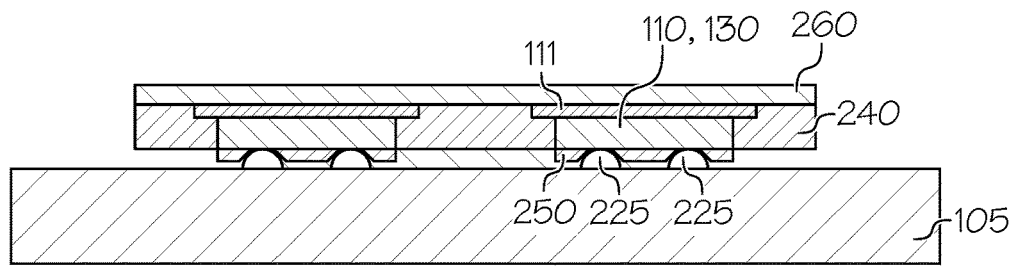

In further embodiments, as shown in FIG. 6E, the substrate (or panel) 260 including the semiconductor die(s) 110 and/or 130 thereon may be mounted on an interconnect structure 105, such as a printed circuit board (PCB) or redistribution layer (RDL) laminate structure, for packaging. The one or more die(s) 110 and/or 130 may be mounted on the interconnect structure 105 in a flip chip configuration, with respective terminals 225 facing the surface of the interconnect structure 105 and electrically connected to conductive patterns thereof.

Figure 6F:
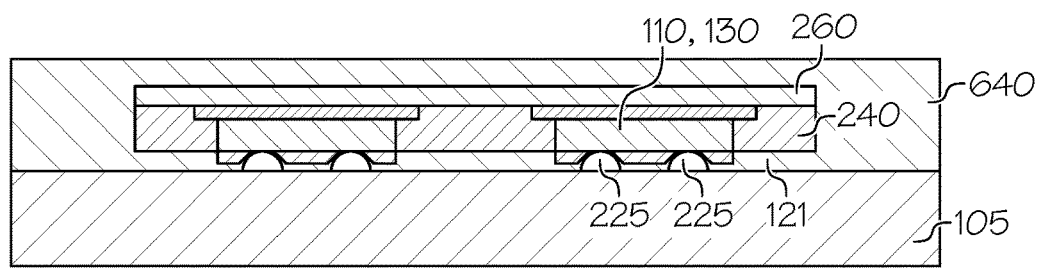

In FIG. 6F, a second protective structure 640 (in this example, an additional encapsulating mold structure) is formed on the surface of the interconnect structure 105 and on one or more surfaces of the protective structure 240 and the substrate or panel 260. In the example of FIG. 6F, the second protective structure 640 is formed so as to cover an entirety of the semiconductor device structure(s) 600 resulting from FIG. 6D, including the surface of the substrate or panel 260 opposite the interconnect structure 105. A portion of the second protective structure 640 extends continuously from the terminals 225 and/or passivation layer 250 of the dies 110 and/or 130 to (and beyond) a periphery of the initial (or "first") protective structure 240 as a support material or layer 121, to provide mechanical support along the interface between the interconnect structure 105 and the elements 110/130, 225, 250, and/or 240 of the semiconductor device structure(s) 600. While illustrated in FIG. 6F as a mold structure, it will be understood that the second protective structure 640 may alternatively be implemented by a lid member (e.g., 841 and 842 in FIG. 8A defining an open cavity 812) or other protective member, in which case the support material or layer 121 may be an underfill material or other layer distinct from the second protective structure 640.

Figure 6G:
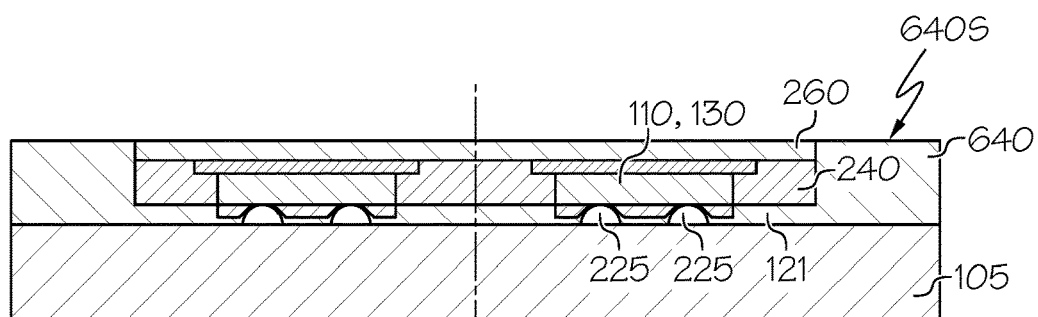
Figure 6H:
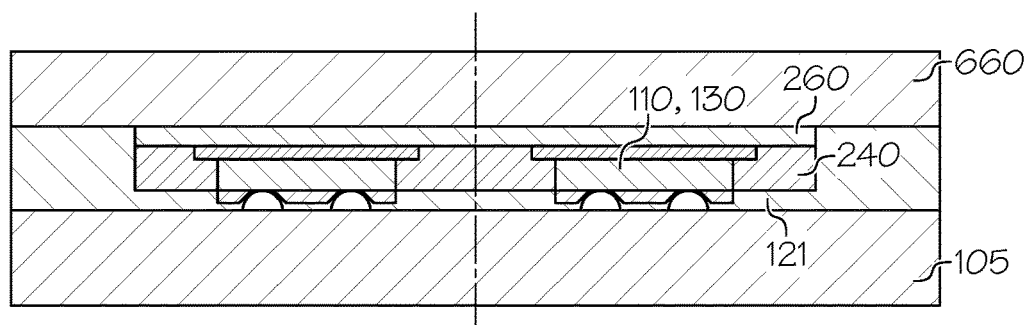

As shown in FIG. 6G, portions of the second protective structure 640 may be removed to expose the surface of the substrate or panel 260 opposite the interconnect structure 105. For example, a mechanical grinding process (e.g., using a rotating or other grinding apparatus) and/or a laser ablation process (using a laser) may be performed to remove the portions of the second protective structure 640. The exposed surface of the substrate or panel 260 may be recessed, protruding, or coplanar with a surface 640s of the second conductive structure 640, depending on the removal process. The surface of the substrate or panel 260 opposite the interconnect structure 105 thus defines a heat dissipating surface that is exposed by the second protective structure 640. In some embodiments, as shown in FIG. 6H, an additional metal or other thermally conductive member 660 may (optionally) be formed on the exposed surface of the substrate or panel 260 to further enhance thermal capability.

Following FIG. 6G (or 6H), the substrate or panel 260, the protective structures 240, 640, the thermally conductive member 660 (when present), and the underlying interconnect structure 105 may be diced or otherwise singulated to define respective semiconductor device packages. Various examples of semiconductor device packages are described below with reference to FIGS. 7A-8B.

Figure 7A:
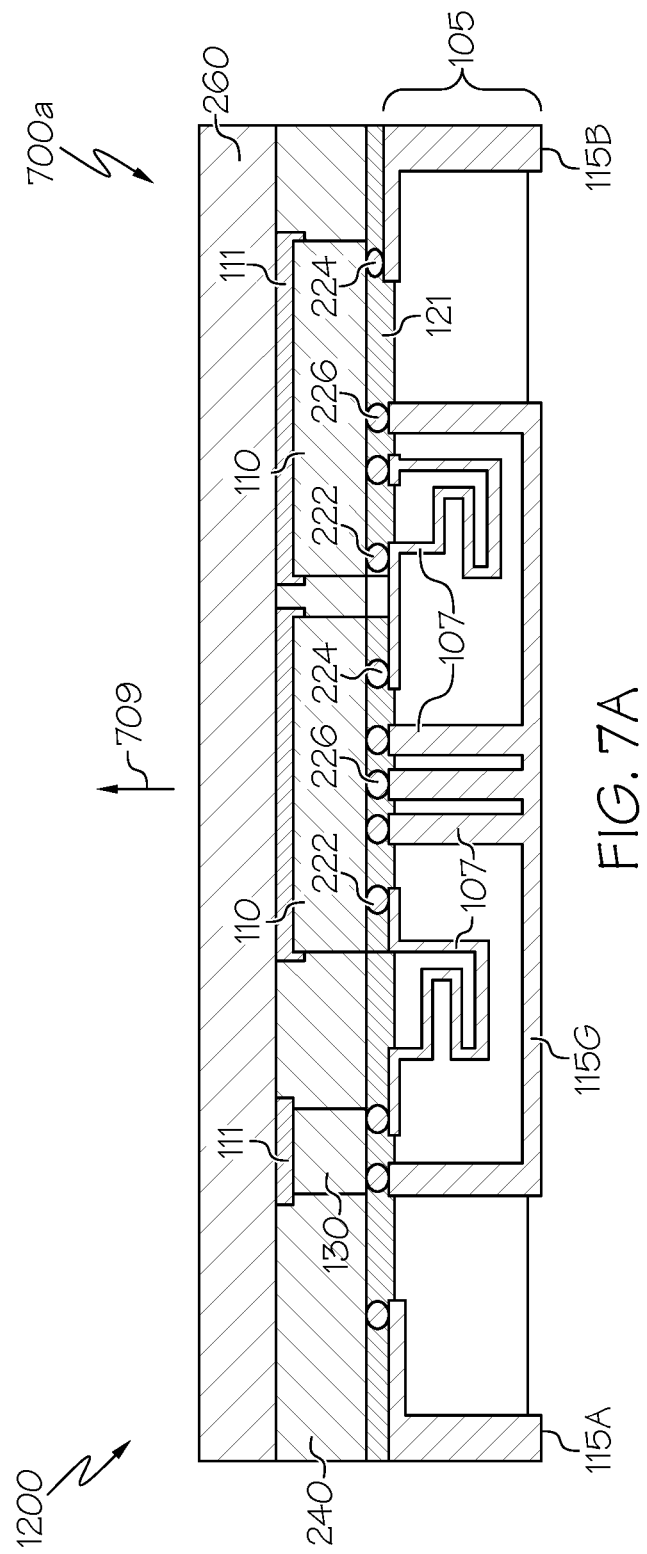
FIGS. 7A and 7B are schematic side views illustrating example semiconductor device packages including dies in flip chip configurations in accordance with some embodiments of the present disclosure.
Figure 7B:
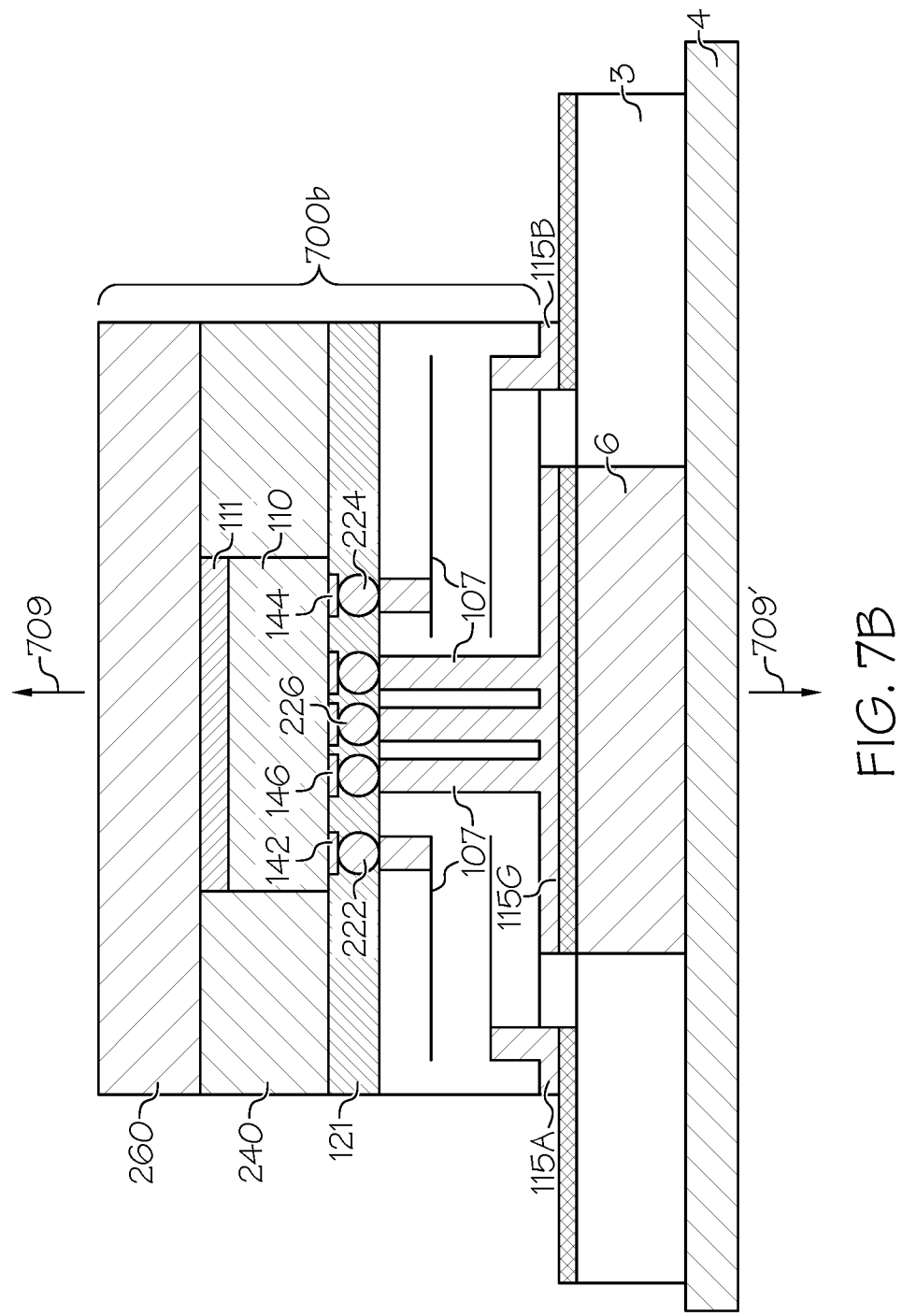

FIGS. 7A and 7B are schematic side views illustrating example semiconductor device packages 700a and 700b including die(s) 110, 130 provided on substrates 260 and having terminals exposed by protective structures 240 in flip chip configurations in accordance with some embodiments of the present disclosure. As shown in FIGS. 7A-7B, the semiconductor device packages 700a, 700b respectively include one or more semiconductor devices as described herein (e.g., 200a, 200b, 300, 400, 600) mounted on an interconnect structure 105.

The interconnect structure 105 may be a single- or multi-layer laminate, such as PCB or RDL laminate structure, with conductive patterns 107 implemented as conductive traces and/or vias in or on the PCB or the RDL laminate structure. Terminals (e.g., gate, drain, and/or source terminals, illustrated as conductive bump or pillar structures 222, 224, and/or 226) of the semiconductor die 110 are adjacent a front or active surface (212 in FIGS. 2A-2B) of the die(s) 110, and are electrically connected to the conductive patterns 107 of the interconnect structure 105 at a first surface of the interconnect structure 105, in a flip chip configuration. A second surface of the interconnect structure 105, which is opposite the first surface having the die(s) 110 thereon, provides an interface that is configured to be mounted on an external device, such as an external circuit board 3 as shown in FIG. 7B. In some embodiments, input leads or terminals 115A and output leads or terminals 115B for the packages 700a, 700b and a ground lead or terminal 115G (collectively, leads 115) may be provided on the second surface of the interconnect structure 105. In the example packages 700a, 700b of FIGS. 7A-7B, the interconnect structure 105 is a multi-layer laminate including conductive patterns 107 that may be fabricated using semiconductor processing techniques, e.g., by depositing conductive and insulating layers and/or patterns on a base material and by forming vias and conductive routing patterns within the structure.

The semiconductor die(s) 110 may include a semiconductor structure (e.g., a Si-, SiC-, and/or GaN-based structure) defining active transistor unit cells therein. The packages 700a, 700b may further include various passive electrical components, which may include resistors, inductors, and/or capacitors implemented by discrete devices (e.g., SMDs or IPDs with thin film substrates such as silicon, alumina, or glass), and/or by elements integrated in the interconnect structure (e.g., spiral inductors, laminate-based transmission lines, etc.). The passive electrical components may be configured, for example, to provide impedance matching and/or harmonic termination circuits, and may be coupled to respective gate 222, drain 224, or source 226 terminals of the transistor die(s) 110 (for example, between the respective terminals 222, 224, or 226 and the input, output, or ground connections 115). As shown in FIG. 7A, a semiconductor die 130 comprising one or more passive electrical component(s) is implemented in a flip chip configuration, with respective terminals facing the interconnect structure and electrically connected to the conductive patterns. Additionally or alternatively, the conductive patterns 107 within the interconnect structure 105 may define one or more passive electrical components (shown with reference to buried spiral inductors by way of example) in some embodiments.

As shown in FIGS. 7A-7B, the die(s) 110, 130 are mounted on a first surface of the interconnect structure 105 (with support material 121 therebetween) in a flip chip configuration, with respective terminals 222, 224, and/or 226 on the active surface of the die(s) 110 facing toward the interconnect structure 105 for electrical connection with the conductive patterns 107. The inactive surface of the die(s) 110 faces away from the interconnect structure 105. The passive electrical component die(s) 130 are similarly mounted on the first surface of the interconnect structure 105 in a flip chip configuration, with the back or inactive surface facing away from the interconnect structure 105.

A protective structure 240 (in this example, a mold structure) provides environmental protection for the die(s) 110, 130. For example, the mold structure 240 may be formed of a dispensed and cured encapsulant or compound, such as a plastic or a plastic polymer compound, which encapsulates or otherwise covers the die(s) 110, 130 and one or more surfaces of the interconnect structure 105. The protective structure 240 exposes the terminals 225 of the die(s) 110, 130. In some embodiments, a surface of the protective structure 240 facing the interconnect structure 105 may be substantially coplanar with the front surfaces 212 of the die(s) 110, 130. In some embodiments, the surface of the protective structure 240 facing the interconnect structure 105 may be recessed or protruding relative to the front surfaces 212 of the die(s) 110, 130 facing the interconnect structure 105.

The support material 121 is provided to mechanically support the terminals 225 and/or the protective structure 240 when mounted on the interconnect structure. In particular, the support material 121 extends between the first surface 212 of dies 110 and/or 130 and the interconnect structure 105, and between the surface of the protective structure 240 and the interconnect structure 105. In some embodiments, the support material 121 extends (e.g., continuously) from the terminals 225 on the first surface 212 of the dies 110 and/or 130 to (or beyond) a periphery of the protective structure 240 adjacent the edges of the packages 700a, 700b. In some embodiments, such as shown in FIG. 7B, one or more dimensions of the package 700b may extend beyond one or more dimensions of the die 110 by about 300 µm or less, such that the support material 121 may likewise extend from the terminals 225 to beyond the die 110 by about 300 µm or less. In some embodiments, the support material 121 may be an underfill material or layer. In some embodiments, the support material 121 may be a portion of a mold compound or structure (e.g., the second mold structure 640 of FIG. 6F). While illustrated in the packages 700a, 700b as providing mechanical support at a surface of the interconnect structure 105 along an interface with the semiconductor die(s) 110, 130 and terminals 225 thereof, it will be understood that the support material 121 may more generally extend along an interface between the semiconductor die(s) 110, 130/terminals 225/protective structure 240 and other packaging components, or even external devices (e.g., in embodiments where the substrate 260 and die(s) 110, 130 are mounted directly on a circuit board or other external device).

The semiconductor device packages 700a, 700b may be configured to electrically couple the package connections 115 to an external device, such as a circuit board 3 as shown in FIG. 7B. The circuit board 3 may include conductive elements or traces on a surface thereof, and the semiconductor device packages 700a, 700b may be configured such that the input connections 115A, output connections 115B, and/or ground connections 115G are aligned with corresponding ones of the conductive elements on the external circuit board 3 for electrical connection. While described with reference to the package 700b, it will be understood that the package 700a may be similarly mounted on and/or electrically coupled to the circuit board 3.

In the example of FIG. 7B, the circuit board 3 further includes an integrated thermal dissipation member, illustrated by way of example as a thermally conductive coin 6 that extends through the circuit board 3 and a heat sink 4 on a surface of the circuit board 3 opposite to the surface on which the package 700b is mounted. As such, the example package 700b may be configured to provide one or more thermally conductive paths for dissipating heat away from an external device 3. In particular, heat may be dissipated at the top side of the package 700b by a first thermal path 709, as defined by the thermally conductive substrate 260 on the back surfaces (e.g., 214) of the die(s) 110, 130. Heat may also be dissipated at the bottom side of the package 700b by a second thermal path 709', as defined by the terminals 226, the conductive patterns 107, the ground reference 115G, the coin 6, and the heatsink 4 (which may also provide an electrical path to a ground connection).

The circuit board 3 may include additional active and/or passive electrical components in some embodiments. For example, the circuit board 3 may include additional passive electrical components that are configured to provide input and/or output pre-matching circuits for the one or more amplifiers of the package 700b.

Figure 8A:
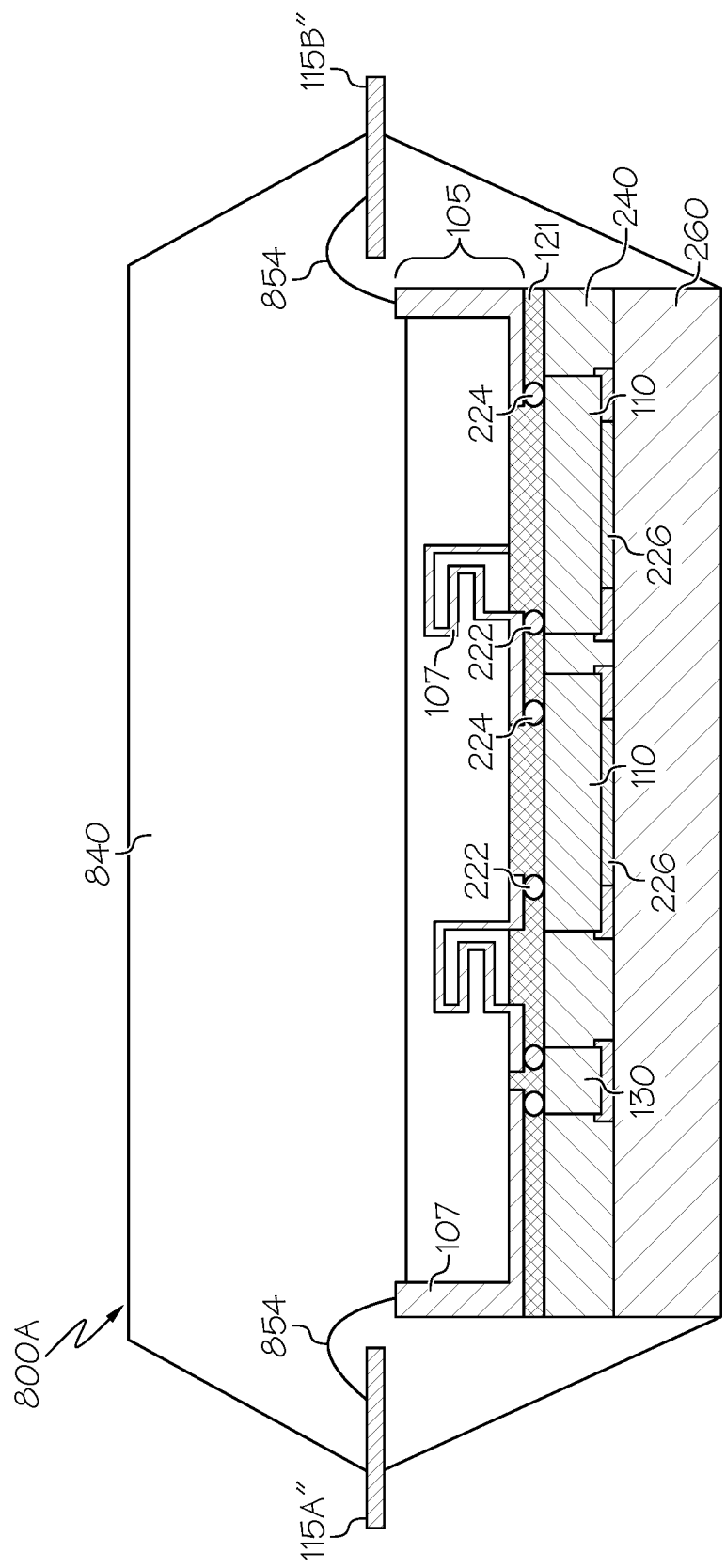
FIGS. 8A and 8B are schematic side views illustrating example semiconductor device packages in leadframe configurations in accordance with some embodiments of the present disclosure.
Figure 8B:
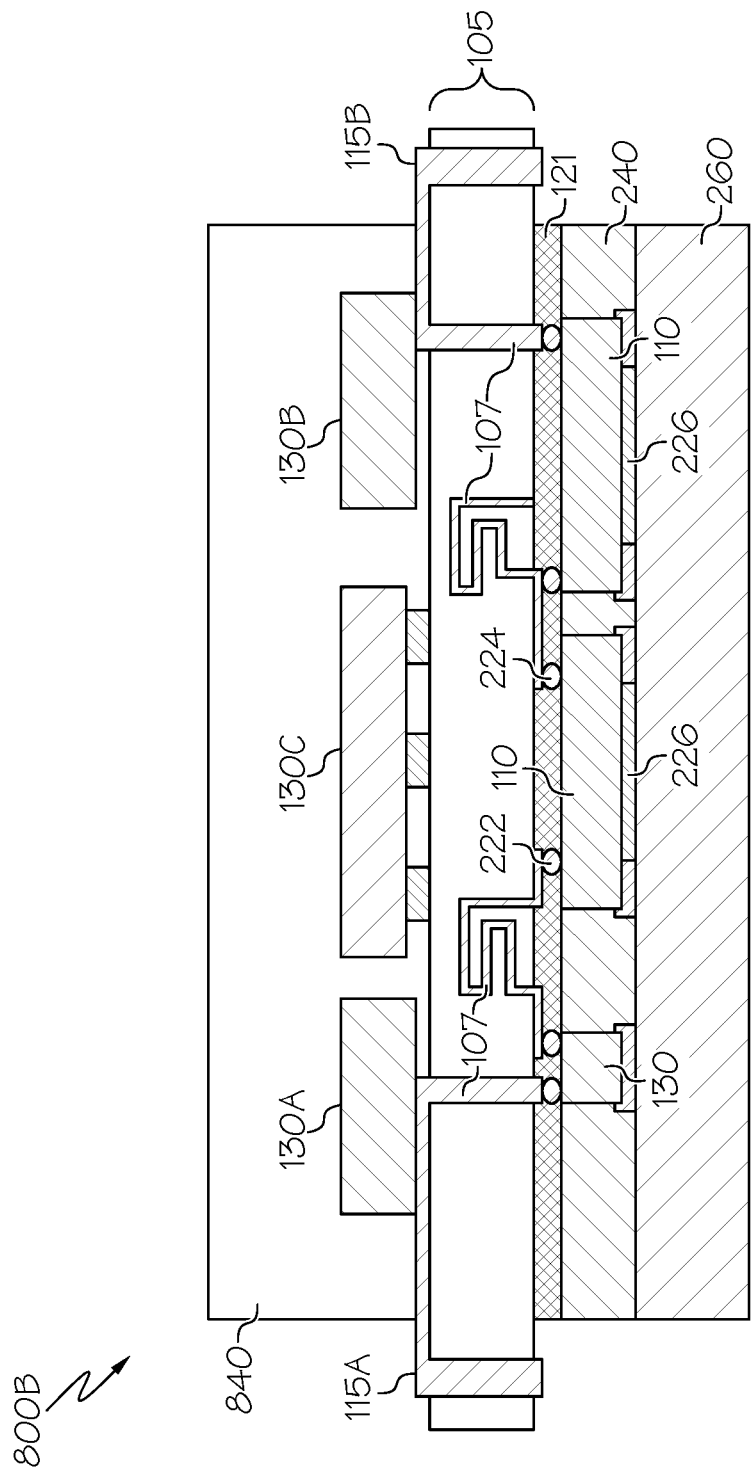

FIGS. 8A and 8B are schematic side views illustrating example semiconductor device packages 800A and 800B including die(s) 110, 130 provided on substrates 260 and having terminals exposed by protective structures 240 in leadframe configurations in accordance with some embodiments of the present disclosure. In the examples of FIGS. 8A-8B, gate and drain terminals 222, 224 of the dies 110 are on the front surface 212, while the source terminal 226 is on the back surface 214. The source terminal 226 may be mounted on the substrate 260 using, for example, a conductive die attach material 111. The substrate 260 may provide the electrical connection to the source terminal 226 and may also serve as a heat dissipation structure to dissipate heat that is generated in the dies 110. For example, a bottom surface of the substrate 260 may be exposed by the packages 800A, 800B as a heat conduction path. More generally, the substrate 260 may include materials and/or physical orientations configured to assist with the thermal management of the packages 800A, 800B.

As shown in FIG. 8A, the semiconductor device package 800A includes the die(s) 110, 130 and substrate 260 packaged in an overmold package structure 800A. The package 800A includes metal gate leads 115A", metal drain leads 115B", and an interconnect structure 105 including conductive patterns 107 therein and/or thereon that provides the electrical connections between dies 110, 130. A protective structure 840 (in this example, a plastic overmold) at least partially surrounds the substrate 260, the dies 110,130, the interconnect structure 105, and the leads 115A", 115B" (which in this example are coupled to the interconnect structure 105 by bond wires 854). A support material 121 may extend between the dies 110 and/or 130 and the interconnect structure 105, and between the protective structure 240 and the interconnect structure 105 (e.g., from the terminals 225 to a periphery of the protective structure 240) to provide mechanical support along the interface therebetween.

While shown in FIG. 8A with the protective structure 840 implemented as an mold structure, the protective structure 840 may instead be implemented by a lid member and sidewalls that define an open or air-filled cavity. The sidewalls and/or lid may be formed of or include an insulating material in some embodiments. For example, the sidewalls and/or lid may be formed of or include ceramic materials. In some embodiments, the sidewalls and/or lid may be formed of, for example, $Al_2O_3$. The lid may be glued to the sidewalls using an epoxy glue. The sidewalls 840 may be attached to a surface of the substrate 260, for example, by brazing. The gate lead 115A" and the drain lead 115B" may be configured to extend through the sidewalls, though embodiments of the present invention are not limited thereto.

As shown in FIG. 8B, the semiconductor device package 800B is similar to the semiconductor device package 800A of FIG. 8A, except that the interconnect structure 105 including conductive patterns 107 therein and/or thereon provides the leads 115A, 115B and the electrical connections between dies 110, 130, and the leads 115A, 115B. The package 800B may thus be free of wirebonds. The package 800B further includes one or more passive components or dies 130A, 130B, 130C (e.g., IPDs and/or SMDs) on an opposite side of the interconnect structure 105 to the dies 110, 130. The one or more passive components or dies 130A, 130B, 130C are covered by a protective structure 840 that exposes respective terminals thereof, similar to the protective structure 240. As such, first die(s) 110 and/or 130 having a protective structure 240 that exposes respective terminals thereof are mounted on a first surface of the interconnect structure 105, and second die(s) 130A, 130B, 130C having a protective structure 840 that exposes respective terminals thereof are mounted on a second surface of the interconnect structure 105, opposite the first surface. While shown as a mold compound by way of example, in some embodiments the protective structure 840 may be implemented by a lid member and sidewalls to define an air-filled or open cavity around the passive components or dies 130A, 130B, 130C. Other components of RF transistor amplifier 800B may be the same as the like-numbered components of RF transistor amplifier 800A, and hence further description thereof will be omitted.

Matching circuits may also be implemented within any of the packages 800A, 800B, for example, by one or more of the discrete passive components 130, 130A, 130B, 130C, and/or by spiral inductors, laminate-based transmission lines, or other passive elements integrated within the interconnect structure 105. The matching circuits may include impedance matching and/or harmonic termination circuits. The impedance matching circuits may be used to match the impedance of the fundamental component of RF signals that are input to or output from the die(s) 110 to the impedance at the input or output of the die(s) 110, respectively. The harmonic termination circuits may be used to ground harmonics of the fundamental RF signal that may be present at the input or output of the die(s) 110.

Accordingly, embodiments of the present disclosure may provide respective terminals (e.g., using conductive pillars or conductive bumps) for die to leadframe electrical connections, but may form the respective terminals after forming a mold or other protective structure around the active or passive component dies. Embodiments of the present disclosure may improve heat transfer of GaN die by allowing backside cooling through the leadframe flange, and/or may improve RF performance by reducing parasitic loading by using copper pillar/solderbump/bump instead of wires for die to external connection. In some embodiments, fabrication methods as described herein may attach one or more flip chip dies to a leadframe or other flange with active side of die(s) facing up, mold the die(s) and leadframe together such that the electrical contacts or die pads are exposed by the mold structure, and then provide die pad interconnect components or terminals (e.g., copper pillars, solderballs, solder bumps) to the exposed electrical contacts or die pads. The fabrication methods may be performed in parallel for a sheet or panel including a plurality of flanges, which may be singulated to define respective semiconductor devices for packaging and/or direct attachment to external circuit boards.

Embodiments of the present disclosure may be used in higher power/higher frequency RF power products that may benefit from flip chip configurations and top side cooling. For example, some embodiments of the present disclosure may be used in high power RF transistors for cellular or aerospace and defense (A&D) applications, such as 20 W or higher average output power RF transistors for 5G base station applications at 3.5 GHz and above. Embodiments of the present disclosure may also allow for lower cost products that are configured to operate at higher frequencies. While embodiments of the present disclosure have been described herein with reference to particular HEMT structures, the present disclosure should not be construed as limited to such structures, and may be applied to formation of many different transistor structures, such as pHEMTs (including GaAs/AlGaAs pHEMTs) and/or GaN MESFETs.

Various embodiments have been described herein with reference to the accompanying drawings in which example embodiments are shown. These embodiments may, however, be embodied in different forms and should not be construed as limited to the embodiments set forth herein. Rather, these embodiments are provided so that this disclosure is thorough and complete and fully conveys the inventive concept to those skilled in the art. Various modifications to the example embodiments and the generic principles and features described herein will be readily apparent. In the drawings, the sizes and relative sizes of layers and regions are not shown to scale, and in some instances may be exaggerated for clarity.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprises," "comprising," "includes," and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

It will be understood that when an element such as a layer, region, or substrate is referred to as being "on," "attached," or extending "onto" another element, it can be directly on the other element or intervening elements may also be present. In contrast, when an element is referred to as being "directly on" or "directly attached" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. Elements illustrated by dotted lines may be optional in the embodiments illustrated.

Like numbers refer to like elements throughout. Thus, the same or similar numbers may be described with reference to other drawings even if they are neither mentioned nor described in the corresponding drawing. Also, elements that are not denoted by reference numbers may be described with reference to other drawings.

In the drawings and specification, there have been disclosed typical embodiments of the invention and, although specific terms are employed, they are used in a generic and descriptive sense only and not for purposes of limitation, the scope of the invention being set forth in the following claims.

That which is claimed:

1. A method of fabricating a semiconductor device, the method comprising:
   forming openings in a passivation layer that expose one or more electrical contacts on a first surface of at least one die on a substrate;
   after forming the openings in the passivation layer, forming a protective structure on the at least one die, wherein the protective structure exposes the passivation layer and the one or more electrical contacts on the first surface of the at least one die; and
   forming respective terminals on the one or more electrical contacts exposed by the protective structure.

2. The method of claim 1, further comprising:
   attaching a second surface of the at least one die to the substrate with a die attach material therebetween, wherein the second surface is opposite the first surface.

3. The method of claim 2, wherein the die attach material and the substrate comprise respective thermally conductive materials.

4. The method of claim 1, wherein the substrate comprises a thermally insulating material or semi-insulating material.

5. The method of claim 1, wherein the protective structure comprises a mold structure.

6. The method of claim 5, wherein forming the protective structure comprises a film assisted molding process wherein a film covers the one or more electrical contacts during formation of the mold structure.

7. The method of claim 1, further comprising:
   after forming the respective terminals, singulating the substrate to define a plurality of semiconductor devices, wherein each of the semiconductor devices comprises one or more of the at least one die.

8. The method of claim 7, wherein the substrate has one or more dimensions of about 8 inches to about 12 inches.

9. The method of claim 1, wherein forming the respective terminals comprises forming conductive bumps or conductive pillar structures on the one or more electrical contacts.

10. The method of claim 1, further comprising:
    providing the at least one die on an interconnect structure, wherein the respective terminals are electrically connected to conductive patterns of the interconnect structure.

11. The method of claim 10, wherein the at least one die is mounted on the interconnect structure in a flip chip configuration in which the respective terminals on the first surface of the at least one die are facing the interconnect structure.

12. The method of claim 11, further comprising:
    forming a support material between the first surface of the at least one die and the interconnect structure, wherein the support material extends from the respective terminals to a periphery of the protective structure.

13. The method of claim 10, wherein the at least one die is on a first surface of the interconnect structure, and wherein a second surface of the interconnect structure is opposite the first surface and is configured to be mounted on an external device.

14. The method of claim 13, wherein the second surface of the interconnect structure comprises input and output connections for a semiconductor device package.

15. The method of claim 1, wherein the at least one die comprises one or more active transistor devices having gate, source, or drain connections coupled to the respective terminals.

16. The method of claim 15, wherein at least one of the gate, source, or drain connections is on a second surface of the at least one die opposite the first surface, and is coupled to one or more conductive via structures that extend through the at least one die.

17. The method of claim 1, wherein the at least one die comprises one or more passive electrical components.

18. A method of fabricating a semiconductor device package, the method comprising:
    forming a protective structure on at least one die, wherein the protective structure exposes a first surface of the at least one die that is opposite a second surface thereof, and the second surface is on a substrate;
    forming respective terminals on the first surface of the at least one die exposed by the protective structure; and
    mounting the first surface of the at least one die on an interconnect structure in a flip chip configuration wherein the respective terminals are facing the interconnect structure and are electrically connected to conductive patterns thereof,
    wherein the second surface of the at least one die and the substrate provide a heat dissipating surface that is exposed opposite the interconnect structure.

19. The method of claim 18, further comprising:
    forming a support material between the first surface of the at least one die and the interconnect structure, wherein the support material extends from the respective terminals to a periphery of the protective structure adjacent edges of the semiconductor device package.

20. The method of claim 19, wherein the support material comprises an underfill material.

21. The method of claim 19, wherein the protective structure is a first protective structure, and further comprising:
    forming a second protective structure on the interconnect structure and the substrate.

22. The method of claim 21, wherein the die attach material and the substrate comprise respective thermally conductive materials, and wherein the second protective structure exposes at least a portion of the substrate.

23. The method of claim 22, wherein forming the second protective structure comprises a laser ablation process or a mechanical grinding process that removes a portion thereof to expose the at least a portion of the substrate.

24. The method of claim 18, further comprising:
   after mounting the first surface of the at least one die on the interconnect structure, providing a thermally conductive member on the heat dissipating surface that is exposed opposite the interconnect structure.

25. A semiconductor device package, comprising:
   a substrate;
   at least one die comprising a first surface having respective terminals thereon, and a second surface that is on the substrate;
   a protective structure on the at least one die and the substrate, wherein the protective structure exposes the respective terminals on the first surface of the at least one die; and
   a support material on the first surface of the at least one die, wherein the support material comprises an underfill layer that extends from the respective terminals to a periphery of the protective structure adjacent edges of the semiconductor device package.

26. The semiconductor device package of claim 25, further comprising:
   an interconnect structure having the at least one die thereon in a flip chip configuration wherein the respective terminals on the first surface of the at least one die are facing the interconnect structure,
   wherein the underfill layer continuously extends along the first surface of the at least one die and along a surface of the protective structure to a periphery of the interconnect structure adjacent the edges of the semiconductor device package.

* * * * *